United States Patent
Myung et al.

(10) Patent No.: US 9,774,352 B2
(45) Date of Patent: Sep. 26, 2017

(54) TRANSMITTING APPARATUS, AND PUNCTURING METHOD THEREOF

(71) Applicant: SAMSUNG ELECTRONICS CO., LTD., Suwon-si (KR)

(72) Inventors: Se-ho Myung, Yongin-si (KR); Hong-sil Jeong, Suwon-si (KR); Kyung-joong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 354 days.

(21) Appl. No.: 14/488,689

(22) Filed: Sep. 17, 2014

(65) Prior Publication Data
US 2015/0082113 A1    Mar. 19, 2015

Related U.S. Application Data

(60) Provisional application No. 61/878,786, filed on Sep. 17, 2013, provisional application No. 61/883,260, filed on Sep. 27, 2013.

(30) Foreign Application Priority Data

Sep. 17, 2014 (KR) .................. 10-2014-0123669

(51) Int. Cl.
*H03M 13/11* (2006.01)
*H03M 13/27* (2006.01)
(Continued)

(52) U.S. Cl.
CPC ... *H03M 13/1165* (2013.01); *H03M 13/2757* (2013.01); *H03M 13/6362* (2013.01);
(Continued)

(58) Field of Classification Search
CPC ......... H03M 13/2757; H03M 13/6362; H03M 13/1165
See application file for complete search history.

(56) References Cited

U.S. PATENT DOCUMENTS

2006/0156199 A1* 7/2006 Palanki ............ H03M 13/2757
                                                    714/776
2009/0138785 A1* 5/2009 Sakai ................ H03M 13/1102
                                                    714/790
(Continued)

FOREIGN PATENT DOCUMENTS

JP         2012-114527 A    6/2012
KR   10-2012-0022852 A      3/2012

OTHER PUBLICATIONS

J. Hagenauer, "Rate-compatible punctured convolutional codes and their applications," IEEE Trans. Commun., vol. 43, No. 6, pp. 389-400, Apr. 1988.*

(Continued)

*Primary Examiner* — Steve Nguyen
(74) *Attorney, Agent, or Firm* — Sughrue Mion, PLLC

(57) ABSTRACT

There is provided a transmitting apparatus. The transmitting apparatus includes an encoder configured to perform Low Density Parity Check (LDPC) encoding with respect to input data, based on a parity check matrix, a parity interleaver configured to interleave parity bits from among LDPC codewords generated by the LDPC encoding, and a puncturer configured to puncture at least a part of the interleaved parity bits, and the puncturer groups the parity bits based on an interval at which a pattern of columns is repeated in an information word sub matrix constituting the parity check matrix and perform puncturing based on the number of punctured parity bits and a position of punctured parity bit groups from among the grouped parity bit groups.

12 Claims, 19 Drawing Sheets

(51) Int. Cl.
  *H03M 13/00* (2006.01)
  *H03M 13/15* (2006.01)
  *H03M 13/29* (2006.01)
(52) U.S. Cl.
  CPC ....... *H03M 13/1111* (2013.01); *H03M 13/152* (2013.01); *H03M 13/2906* (2013.01)

(56) References Cited

U.S. PATENT DOCUMENTS

| | | | |
|---|---|---|---|
| 2009/0158129 A1 | 6/2009 | Myung et al. | |
| 2010/0205511 A1* | 8/2010 | Murakami | H03M 13/118 714/781 |
| 2010/0306627 A1* | 12/2010 | Sakai | H03M 13/116 714/781 |
| 2011/0119568 A1* | 5/2011 | Jeong | H03M 13/1185 714/790 |
| 2011/0197105 A1* | 8/2011 | Murakami | H03M 13/116 714/752 |
| 2012/0051335 A1 | 3/2012 | Kimura et al. | |
| 2012/0185757 A1* | 7/2012 | Jeong | H03M 13/2906 714/801 |
| 2012/0216099 A1* | 8/2012 | Jeong | H03M 13/1102 714/800 |
| 2012/0300690 A1 | 11/2012 | Vare et al. | |
| 2013/0055051 A1 | 2/2013 | Jeong et al. | |
| 2013/0232394 A1 | 9/2013 | Ko et al. | |
| 2013/0246883 A1 | 9/2013 | Shinya et al. | |
| 2013/0265957 A1 | 10/2013 | Mourad et al. | |

OTHER PUBLICATIONS

Communication dated Mar. 27, 2015 issued by the U.S. Patent and Trademark Office in counterpart U.S. Appl. No. 14/489,781.
International Search Report dated Dec. 29, 2014 issued by International Searching Authority in counterpart International Application No. PCT/KR2014/008675.
Written Opinion dated Dec. 29, 2014 issued by International Searching Authority in counterpart International Application No. PCT/KR2014/008675.
Written Opinion dated Dec. 29, 2014 issued by International Searching Authority in counterpart International Application No. PCT/KR2014/008718.
International Search Report dated Dec. 29, 2014 issued by International Searching Authority in counterpart International Application No. PCT/KR2014/008718.

* cited by examiner

TRANSMITTING APPARATUS, AND PUNCTURING METHOD THEREOF

CROSS-REFERENCE TO RELATED APPLICATION(S)

This application claims priority from U.S. Patent Application No. 61/883,260 filed on Sep. 27, 2013 in the United States Patent and Trademark Office, and U.S. Patent Application No. 61/878,786 in the United States Patent and Trademark Office filed on Sep. 17, 2013, and Korean Patent Application No. 10-2014-0123669 field on Sep. 17, 2014, in the Korean Intellectual Property Office, in the disclosures of which are incorporated herein by reference in their entirety.

TECHNICAL FIELD

The present invention relates to a transmitting apparatus and a puncturing method thereof, and more particularly to, a transmitting apparatus which punctures and transmits at least a part of bits parity bits and a puncturing method thereof.

BACKGROUND

In the information-oriented society of the $21^{st}$ century, broadcasting communication services are entering the era of digitization, multi-channel, broadband, and high quality. In particular, as high-quality digital television (TV), portable multimedia player (PMP), and portable broadcasting apparatuses have been increasingly used in recent years, there is an increasing demand for digital broadcasting services that are able to support various receiving methods.

The standard group has prepared various standards to live up to such a demand, and provided various services that can satisfy the needs of users. Accordingly, a method enabling to provide users with better services having excellent performances is necessary.

SUMMARY

One or more exemplary embodiments provide a transmitting apparatus which punctures and transmits at least a part of parity bits based on a specific puncturing pattern in order to improve decoding performance for the receiving side.

According to an aspect of an exemplary embodiment, there is provided a transmitting apparatus which includes an encoder configured to perform Low Density Parity Check (LDPC) encoding with respect to input data, based on a parity check matrix, a parity interleaver configured to interleave parity bits from among LDPC codewords generated by the LDPC encoding, and a puncturer configured to puncture at least a part of the interleaved parity bits, and the puncturer groups the parity bits based on an interval at which a pattern of columns is repeated in an information word sub matrix constituting the parity check matrix and perform puncturing based on the number of punctured parity bits and a position of punctured parity bit groups from among the grouped parity bit groups.

The puncturer may determine a position of the punctured parity bit groups based on a predefined puncturing pattern and the number of the punctured parity bits.

The puncturer may determine the number of the punctured parity bit groups based on a value which divides the number of the punctured parity bits by the interval at which a pattern of columns is repeated and determine a position of the punctured parity bit groups based on the determined number of the parity groups and the predefined puncturing pattern.

In response to the number of the punctured parity bits being divided by the interval at which a pattern of columns is repeated, the puncturer may determine a divided value as the number of the punctured parity bit groups and puncture the parity bit groups on the determined position in a unit of groups according to the predefined puncturing pattern.

In response to the number of the punctured parity bits not being divided by the interval at which a pattern of columns is repeated, the puncturer may determine a value which adds 1 to a divided value as the number of the punctured parity bit groups and puncture at least a part of the parity bit groups on the determined position according to the predefined puncturing pattern.

In response to the divided value being 0, the puncturer may puncture parity bits corresponding to a remaining value which is obtained by dividing the number of the punctured parity bits by the interval at which a pattern of columns is repeated in the parity bit groups on the determined position according to the predefined puncturing pattern.

In response to the divided value being higher than 1, the puncturer may puncture parity bits corresponding to a remaining value which is obtained by dividing the number of the punctured parity bits by the interval at which a pattern of columns is repeated in the last parity group from among the parity bit groups on the determined position according to the predefined puncturing pattern and puncture the other parity bit groups in a unit of groups.

The predefined puncturing pattern may be determined by a table 6 shown below.

The interval at which a pattern of columns is repeated may be 360.

According to an aspect of an exemplary embodiment, there is provided a method of puncturing a transmitting apparatus which includes performing Low Density Parity Check (LDPC) encoding with respect to input data based on a parity check matrix, interleaving parity bits from among LDPC codewords generated by the LDPC encoding, and puncturing at least a part of the interleaved parity bits, and the puncturing comprises grouping the parity bits based on an interval at which a pattern of columns is repeated in an information word sub matrix constituting the parity check matrix and performing puncturing based on the number of punctured parity bits and a position of punctured parity bit groups from among the grouped parity bit groups.

The puncturing may include determining a position of the punctured parity bit groups based on a predefined puncturing pattern and the number of the punctured parity bits.

The puncturing may include determining the number of the punctured parity bit groups based on a value which divides the number of the punctured parity bits by the interval at which a pattern of columns is repeated and determining a position of the punctured parity bit groups based on the determined number of the parity groups and the predefined puncturing pattern.

In response to the number of the punctured parity bits being divided by the interval at which a pattern of columns is repeated, the puncturing may include determining a divided value as the number of the punctured parity bit groups and puncturing the parity bit groups on the determined position in a unit of groups according to the predefined puncturing pattern.

In response to the number of the punctured parity bits not being divided by the interval at which a pattern of columns is repeated, the puncturing may include determining a value which adds 1 to a divided value as the number of the punctured parity bit groups and puncturing at least a part of the parity bit groups on the determined position according to the predefined puncturing pattern.

In response to the divided value being 0, the puncturing may include puncturing the parity bits corresponding to a remaining value which is obtained by dividing the number of the punctured parity bits by the interval at which a pattern of columns is repeated in the parity bit groups on the determined position according to the predefined puncturing pattern.

In response to the divided value being higher than 1, the puncturing may include puncturing the parity bits corresponding to a remaining value which is obtained by dividing the number of the punctured parity bits by the interval at which a pattern of columns is repeated in the last parity group from among the parity bit groups on the determined position according to the predefined puncturing pattern and puncturing the other parity bit groups in a unit of groups.

The predefined puncturing pattern is determined by a table 6 shown below.

The interval at which a pattern of columns is repeated may be 360.

According to various exemplary embodiments, at least a part of LDPC parity bits may be punctured based on a specific puncturing pattern in order to improve decoding performance on the receiving end. Accordingly, decoding performance may be improved on the receiving end.

BRIEF DESCRIPTION OF THE DRAWINGS

The above and/or other aspects will be more apparent by describing in detail exemplary embodiments, with reference to the accompanying drawings, in which.

DETAILED DESCRIPTION

Figure 1:
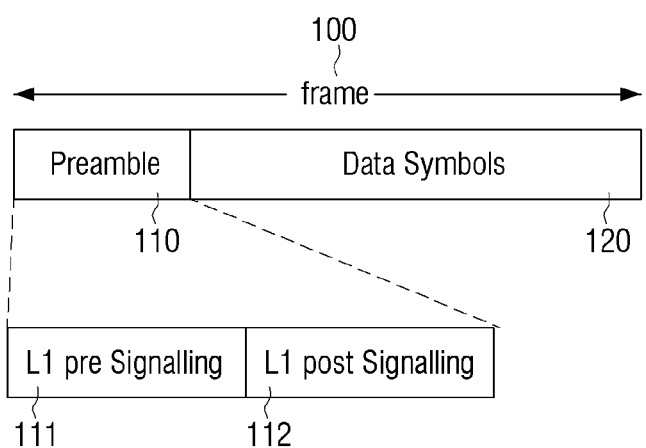
FIG. 1 is a view to describe structure of a frame used for general broadcast/communication system.

Hereinafter, exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of exemplary embodiments. Thus, it is apparent that exemplary embodiments can be carried out without those specifically defined matters. Also, functions or elements known in the related art are not described in detail since they would obscure the exemplary embodiments with unnecessary detail.

FIG. 1 is a view to describe structure of a frame used for general broadcast/communication system. Referring to FIG. 1, a frame 100 includes a preamble 110 and a data symbol 120.

The preamble 110 is a part to which an L1 signal is transmitted, and as illustrated in FIG. 1, the preamble may consist of an L1-pre signaling 111 (that is, L1-pre signaling information) and an L1 post signaling 112 (that is, L1-post signaling information).

Herein, the L1-pre signaling 111 includes information which the receiving apparatus (not illustrated) requires to receive and access the L1-post signaling 112, and the L1-post signaling 112 includes information required to access for the receiving apparatus (not illustrated) to access a physical layer pipe (PLP).

The data symbol 120 is a part to which actual broadcast data is transmitted, and may consist of at least one PLP. In this case, for each PLP, signal processing independent of each other may be processed. For example, different modulation methods and code rates by each PLP may be used.

As described above, in general broadcast/communication system, a transmitting side transmits broadcast data with the frame structure as illustrated in FIG. 1, and a receiving side may obtain information on a method of transmitting data through the L1 signaling and frame length, and receive broadcast data from the PLP.

Hereinbelow, according to an exemplary embodiment, a method of processing the L1-pre signaling out of L1 signaling will be described. However, this is only an example, the processing method below may also be applied to not only L1-pre signaling but also L1-post signaling or broadcast data.

Meanwhile, codeword, information word, parity bit, L1-signaling length mean the number of bits included in each of them.

Figure 2:
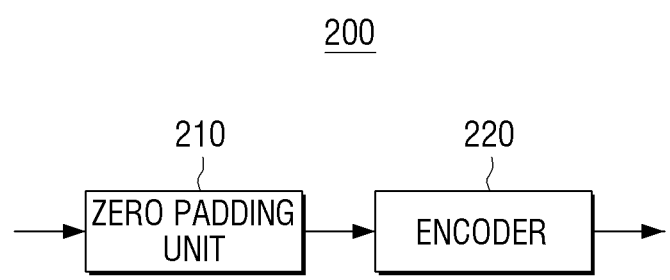
FIG. 2 is a block diagram to describe the configuration of a transmitting apparatus according to an exemplary embodiment.

FIG. 2 is a block diagram to describe the configuration of a transmitting apparatus according to an exemplary embodiment. According to FIG. 2, a transmitting apparatus 200 includes a zero padding unit 210 and an encoder 220.

The zero padding unit 210 pads (or inserts) at least one zero bits (or zero-padded bits) to data to be input. In addition, the zero padding unit 210 outputs the data to which at least one zero bits are padded to the encoder 220.

Here, the data may be L1-pre signaling, but is not limited thereto. The data may be L1-post signaling or broadcast data.

Meanwhile, the L1-pre signaling consists of the fixed number of bits, for example, the L1-pre signaling may consist of 200 bits.

To be specific, as to the BCH and LDPC codes performed in the encoder 220, an information word of the constant length is required, and therefore, the zero padding unit 210 may pad at least one zero bits to the data so as to have the length encodable by the encoder 220.

For example, in response to the data being L1-pre signaling, in that the L1-pre signaling consists of 200 bits, the L1-pre signaling may be shorter than the length of the information word of the BCH code defined in accordance with code rate. Therefore, the zero padding unit 210 may pad the zero bits which are the same as the difference between the information word of the BCH code and the length of the L1-pre signaling to the L1-pre signaling so that the L1-pre signaling has the encodable length.

In this case, based on the parity check matrix used for the LDPC encoding, the zero padding unit 210 may determine a position where at least one zero bits are padded. To be specific, the zero padding unit 210 may pad at least one zero bits to the data so that the data is assigned to a column group having the highest degree, from among a plurality of column groups constituting the information word sub matrix. The details will be described below.

The encoder 220 performs the BCH and LDPC encoding with respect to the data to which at least one zero bits are padded and generates the LDPC codeword.

Figure 3:
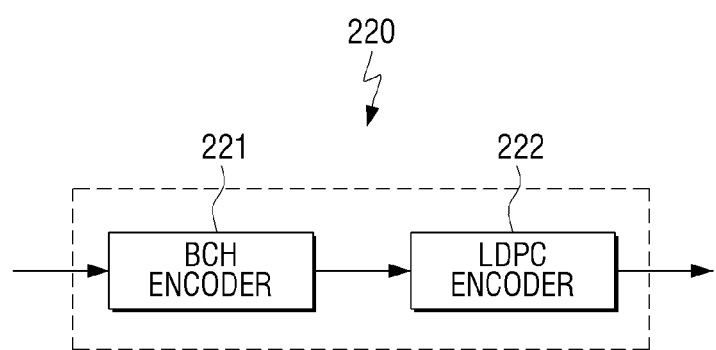
FIG. 3 is a block diagram to describe the configuration of an encoder according to an exemplary embodiment.

For this, the encoder 220 may include a BCH encoder 221 and an LDPC encoder 222 as illustrated in FIG. 3.

The BCH encoder 221 performs the BCH encoding with respect to the data to which at least one zero bits are padded. In addition, the BCH encoder 221 outputs to the LDPC encoder 222 the BCH codeword (or, BCH encoding bits) which is generated by the BCH encoding.

Herein, in that the BCH code is a systematic code, the information word may be included to the BCH codeword as it is. In other words, the BCH encoder 221 performs the BCH encoding as the input bits having the same length as the BCH information word, and the BCH codeword generated therefrom may include the input bits, which is the BCH information word, as it is, and may be a form that the BCH parity bits are added to the BCH information word.

In this case, for example, the input bits are the L1-pre signaling to which at least one zero bits are padded, and the number of bits of the input bits may be the same as the information word bit number (for example, $K_{bch}$) of the BCH code. In addition, the BCH parity bits generated by the BCH encoding may constitute of 168 bits.

The LDPC encoder 222 may perform the LDPC encoding for the BCH codeword, and generate the LDPC codewords (or, LDPC encoding bits).

Herein, in that the LDPC code is a systematic code, the information word may be included to the LDPC codeword as it is. In other words, the LDPC encoder 222 performs the LDPC encoding as the input bits having the same length as the LDPC information word, and the LDPC codeword generated therefrom may include the input bits, which are the LDPC information word, as it is, and may be a form that the LDPC parity bits are added to the LDPC information word.

Herein, the input bits may be the BCH codeword. In this case, the BCH encoder 221 generates the BCH codeword having the length of the information word which is LDPC encodable in the LDPC encoder 222, the number of bits of the input bits may be the same as the information word bit number (for example, $K_{ldpc}$) of the LDPC code.

In this case, the LDPC encoder 222 may generate a LDPC codeword consisting of $K_{ldpc}$ bits by performing LDPC encoding using an information word with respect to the input bits. Here, the LDPC codeword may include an information word consisting of $K_{ldpc}$ bits and LDPC parity bits consisting of $N_{parity}(=N_{ldpc}-K_{ldpc})$ bits.

The LDPC encoder 222 generates the LDPC codeword which satisfies $H \cdot C^T = 0$. Herein, H means the parity check matrix and C means the LDPC codeword. In other words, the LDPC encoder 222 may generate the LDPC codeword which becomes 0 by multiplied by the parity check matrix.

In addition, the LDPC encoder 222 may generate the LDPC codeword having various lengths by performing the LDPC encoding according to various code rates. For example, the LDPC encoder 222 may generate the LDPC codeword constituting of 16200 bits by performing the LDPC encoding with the 11/15, 13/15 codes or the like.

In this case, the LDPC encoder 222 may perform the LDPC encoding based on the parity check matrix having the different structures according to the code rate. Hereinbelow, the parity check matrix will be further detailed.

Figure 4:
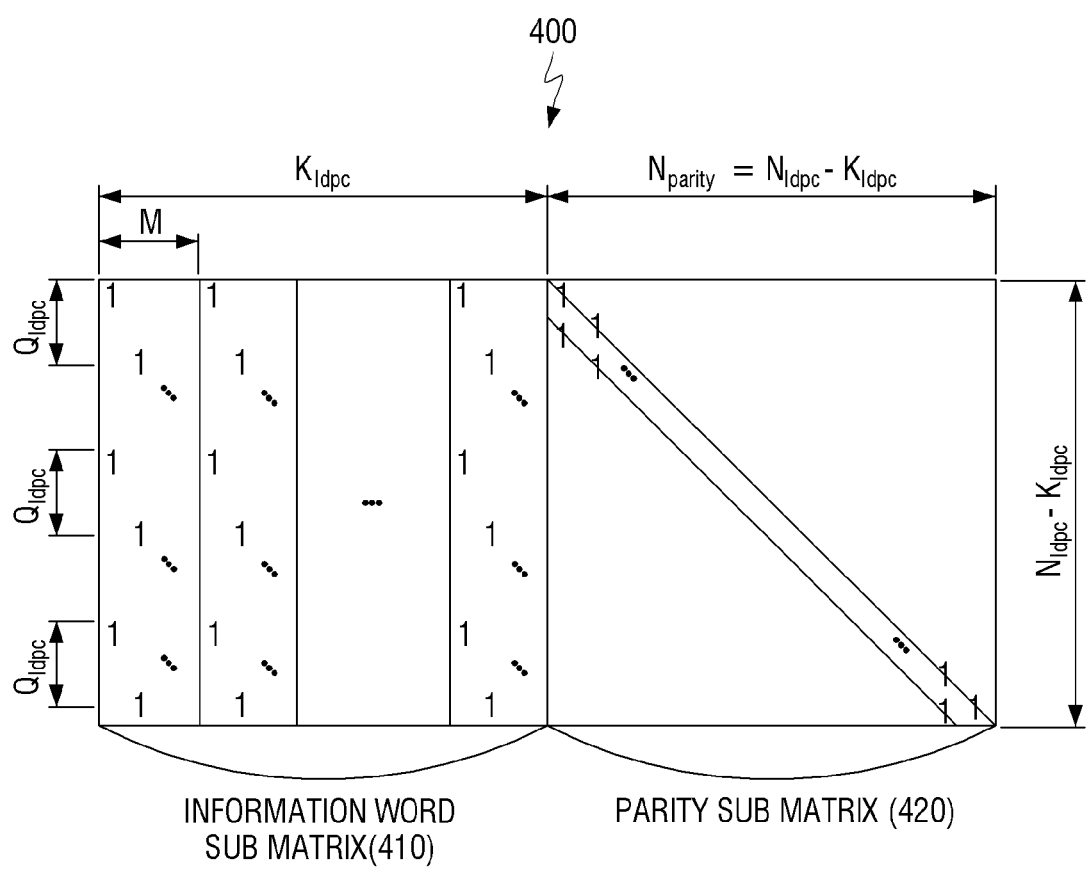
FIG. 4 is a view to describe structure of parity check matrix used for LDPC decoding according to an exemplary embodiment.

FIG. 4 is a view to describe structure of parity check matrix used for LDPC decoding according to an exemplary embodiment.

Referring to FIG. 4, a parity check matrix 400 constitutes of an information word sub matrix 410 which is a sub matrix corresponding to the information word, and a parity sub matrix 420 which is a sub matrix corresponding to the parity bit.

The information word sub matrix 410 includes columns in the number of $K_{ldpc}$, and the parity sub matrix 420 includes the column in the number of $N_{parity}=N_{ldpc}-K_{ldpc}$. The number of columns of the parity check matrix 400 is the same as the number of columns $N_{parity}=N_{ldpc}-K_{ldpc}$ of the parity sub matrix 420.

In addition, in the parity check matrix 400, $N_{ldpc}$ indicates the length of the LDPC codeword; $K_{ldpc}$ indicates the length of the information word, and $N_{parity}=N_{ldpc}-K_{ldpc}$ indicates the length of the parity.

Hereinbelow, the structure of the information word sub matrix 410 and the parity sub matrix 420 is further detailed. Meanwhile, in the information word sub matrix 410 and the parity sub matrix 420, an element of a part except for 1 is 0.

The information word sub matrix 410 which includes Kldpc number of columns (0th to Kldpc-1th columns) follows a rule as below.

Firstly, Kldpc number of columns constituting the information word sub matrix 410 belong to the same group by M number of columns, and thus are grouped into $K_{ldpc}/M$ number of column groups in total. The columns belonging to the same column group are cyclic-shifted from one another as much as $Q_{ldpc}$.

Herein, M is an interval at which a pattern of columns is repeated in the information word sub matrix 410 (e.g, M=360), and $Q_{ldpc}$ is a size by which each column is cyclic-shifted in the information word sub matrix 410. M and $Q_{ldpc}$ are integers and are determined to satisfy $Q_{ldpc}=(N_{ldpc}-K_{ldpc})/M$. In this case, $K_{ldpc}/M$ is also an integer. M and $Q_{ldpc}$ may have variable values according to a length of the LDPC codeword and a code rate.

Secondly, when the degree of $0^{th}$ column of the $i^{th}$ column group (i=0, 1, . . . , $K_{ldpc}/M$) is $D_i$ and a position of each row where 1 exists is $R_{i,0}^{(0)}, R_{i,0}^{(1)}, \ldots, R_{i,0}^{(D_i-1)}$, an index of the row where weight-1 exists in the $j^{th}$ column of the $i^{th}$ column group, $R_{i,j}^{(k)}$, is determined using Equation.

$$R_{i,j}^{(k)} = R_{i,(j-1)}^{(k)} + Q_{ldpc} \bmod(N_{ldpc}-K_{ldpc}) \quad \text{[Equation 1]}$$

Herein, k=0, 1, 2, . . . , Di-1, i=0, 1, . . . , $K_{ldpc}/M$, j=1, 2, . . . , M-1.

Equation 1 may be expressed as Equation 2.

$$R_{i,j}^{(k)} = \{R_{i,0}^{(k)} + (j \bmod M) \times Q_{ldpc}\} \bmod(N_{ldpc} - K_{ldpc}) \quad \text{[Equation 2]}$$

Herein, k=0, 1, 2, . . . , $D_i$−1, i=0, 1, . . . , $K_{ldpc}$/M, j=1, 2, . . . , M−1.

In the above Equations, $R_{i,j}^{(k)}$ is an index of the row where $k^{th}$ weight-1 exists in the $j^{th}$ column of the $i^{th}$ column group, $N_{ldpc}$ is the length of the LDPC codeword, $K_{ldpc}$ is the length of the information word, $D_i$ is a degree of columns belonging to the $i^{th}$ column group, and M is the number of columns belonging to one column group, and Qldpc indicates the size by which each column is cyclic-shifted.

Referring to the above Equations, if only $R_{i,0}^{(k)}$ is known, the index of the row where the $k^{th}$ weight-1 is located in the $i^{th}$ column group can be known. Therefore, when the index value of the row where the $k^{th}$ weight-1 is located in the $0^{th}$ column of each column group is stored, a position of column and row where 1 is located in the parity check matrix 400 (i.e. the information word sub matrix 410 of the parity check matrix 400) having the configuration of FIG. 4 can be known.

According to the above-described rules, all the columns belonging to the $i^{th}$ column group have the same degree $D_i$. Accordingly, the LDPC code which stores information on the parity check matrix according to the above-described rules may be briefly expressed as follows.

For example, when $N_{ldpc}$ is 30, $K_{ldpc}$ is 15, and $Q_{ldpc}$ is 3, position information of the row where weight-1 is located in the $0^{th}$ column of the three column groups may be expressed by a sequence as shown in Equation 3 and may be referred to as 'weight-1 position sequence.'

$$R_{1,0}^{(1)} = 1, R_{1,0}^{(2)} = 2, R_{1,0}^{(3)} = 8, R_{1,0}^{(4)} = 10,$$

$$R_{2,0}^{(1)} = 0, R_{2,0}^{(2)} = 9, R_{2,0}^{(3)} = 13,$$

$$R_{3,0}^{(1)} = 0, R_{3,0}^{(2)} = 14. \quad \text{[Equation 3]}$$

Herein, $R_{i,j}^{(k)}$ is an index of a row where $k^{th}$ weight-1 is located in the $j^{th}$ column in the $i^{th}$ column group.

The weight-1 position sequence like Equation 3 which expresses an index of a row where 1 is located in the $0^{th}$ column of each column group may be briefly expressed in Table 1 presented below.

TABLE 1

1 2 8 10
0 9 13
0 14

Table 1 shows positions of elements having weight-1, that is, a 1 value, in the parity check matrix, and the ith weight-1 position sequence is expressed by indexes of rows where weight-1 is located in the $0^{th}$ column belonging to the ith column group.

The parity sub matrix 420 includes $N_{ldpc}$−$K_{ldpc}$ number of columns (that is, $K_{ldpc}^{th}$ column to $N_{ldpc}$−$1^{th}$ column), and has a dual diagonal configuration. Accordingly, the degree of columns except for the last column (that is, $N_{ldpc}$−$1^{th}$ column) from among the columns included in the parity sub matrix 420 is 2, and the degree of the last column (that is, $N_{ldpc}$−$1^{th}$ column) is 1.

Hereinbelow, the detailed structure of the parity check matrix which is used for the LDPC decoding is described according to an exemplary embodiment.

To be specific, when a length of the LDPC codeword $N_{ldpc}$ is 16200, a length of an information word $K_{ldpc}$ is 14040, a code rate is 13/15, and M is 360, the parity check matrix may be defined as Table 2 shown below.

TABLE 2

| i | Index of row where 1 is located in the $0^{th}$ column of ith column group |
|---|---|
| 0 | 37 144 161 199 220 496 510 589 731 808 834 965 1249 1264 1311 1377 1460 1520 1598 1707 1958 2055 2099 2154 |
| 1 | 20 27 165 462 546 583 742 796 1095 1110 1129 1145 1169 1190 1254 1363 1383 1463 1463 1718 1835 1870 1879 2108 2128 |
| 2 | 288 362 463 505 638 691 745 861 1006 1083 1124 1175 1247 1275 1337 1353 1378 1506 1588 1632 1720 1868 1980 2135 |
| 3 | 405 464 478 511 566 574 641 766 785 802 836 996 1128 1239 1247 1449 1491 1491 1537 1616 1643 1668 1950 1975 2149 |
| 4 | 86 192 245 357 363 374 700 713 852 903 992 1174 1245 1277 1342 1369 1381 1417 1463 1712 1900 1962 2053 2118 |
| 5 | 101 327 378 550 |
| 6 | 186 723 1318 1550 |
| 7 | 118 277 504 1835 |
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 961 1709 1810 |
| 17 | 112 403 1485 2042 |
| 18 | 431 1110 1130 1365 |
| 19 | 587 1005 1206 1588 |
| 20 | 704 1113 1943 |
| 21 | 375 1487 2100 |
| 22 | 1507 1950 2110 |
| 23 | 962 1613 2038 |
| 24 | 554 1295 1501 |
| 25 | 488 784 1446 |
| 26 | 871 1935 1964 |
| 27 | 54 1475 1504 |
| 28 | 1579 1617 2074 |
| 29 | 1856 1967 2131 |
| 30 | 330 1582 2107 |
| 31 | 40 1056 1809 |
| 32 | 1310 1353 1410 |
| 33 | 232 554 1939 |
| 34 | 168 641 1099 |
| 35 | 333 437 1556 |
| 36 | 153 622 745 |
| 37 | 719 931 1188 |
| 38 | 237 638 1607 |

Table 2 shows an index of rows where 1 is located in the $0^{th}$ column of the ith column group of the information word sub matrix of the parity check matrix.

That is, the information word sub matrix consists of 39 column groups each including 360 columns and the position of the value 1 in the $0^{th}$ column of each column group may be defined by Table 2 described above. For example, in the case of the $0^{th}$ column of the $0^{th}$ column group, 1 exists in the $37^{th}$ row, $144^{th}$ row, 161th row, . . . .

In addition, by cyclic-shifting the row where 1 is located in the $0^{th}$ column of each column group by $Q_{ldpc}$, a row where 1 is located in another column of the corresponding column group may be defined.

To be specific, in the case of Table 2, $Q_{ldpc}$=($N_{ldpc}$−$K_{ldpc}$)/M=(16200−14040)/360=6 and the indexes of the rows where 1 is located in the $0^{th}$ column of the $0^{th}$ group are 37, 144, 161, . . . , and indexes of rows where 1 is located in the $2^{nd}$ column of the $0^{th}$ column group may be 43(=37+6), 150(=144+6), 167(=161+6), . . . , and indexes of rows where 1 is located in the 2nd column of the $0^{th}$ column group may be 49(=43+6), 156(=150+6), 173(=167+6), . . . .

As another example, when a length of the LDPC codeword $N_{ldpc}$ is 16200, a length of an information word $K_{ldpc}$ is 14040, a code rate is 13/15, and M is 360, the parity check matrix may be defined as Table 3 shown below.

TABLE 3

Index of row where 1 is located in the $0^{th}$ column of ith column
i group 0 237 638 1607
1 719 931 1188
2 153 622 745
3 333 437 1556
4 168 641 1099
5 232 554 1939
6 1310 1353 1410
7 40 1056 1809
8 330 1582 2107
9 1856 1967 2131
10 1579 1617 2074
11 54 1475 1504
12 871 1935 1964
13 488 784 1446
14 554 1295 1501
15 962 1613 2038
16 1507 1950 2110
17 375 1487 2100
18 704 1113 1943
19 587 1005 1206 1588
20 431 1110 1130 1365
21 112 403 1485 2042
22 92 961 1709 1810
23 483 1318 1358 2118
24 220 1038 1903 2147
25 283 640 981 1172
26 431 865 1568 2055
27 100 475 572 2136
28 62 144 1163 2017
29 387 1253 1328 1975
30 199 407 1776 1965
31 118 277 504 1835
32 186 723 1318 1550
33 101 327 378 550
34 86 192 245 357 363 374 700 713 852 903 992 1174 1245 1277 1342 1369 1381 1417 1463 1712 1900 1962 2053 2118
35 405 464 478 511 566 574 641 766 785 802 836 996 1128 1239 1247 1449 1491 1537 1616 1643 1668 1950 1975 2149
36 288 362 463 505 638 691 745 861 1006 1083 1124 1175 1247 1275 1337 1353 1378 1506 1588 1632 1720 1868 1980 2135
37 20 27 165 462 546 583 742 796 1095 1110 1129 1145 1169 1190 1254 1363 1383 1463 1718 1835 1870 1879 2108 2128
38 37 144 161 199 220 496 510 589 731 808 834 965 1249 1264 1311 1377 1460 1520 1598 1707 1958 2055 2099 2154

Table 3 illustrates an index of a row where 1 exists in the $0^{th}$ column of the $i^{th}$ column group of the information word sub matrix of the parity check matrix.

That is, the information word sub matrix may constitute of 39 column groups including 360 columns respectively, and a position where 1 exists within $0^{th}$ column of each column group may be defined by the abovedescribed Table 3. For example, in case of $0^{th}$ column of the $0^{th}$ column group, 1 may exist in the $237^{th}$ row, $638^{th}$ row, and $1607^{th}$ row, . . . .

In addition, by cyclic-shifting the row where 1 exists at $0^{th}$ row of each row group as much as $Q_{ldpc}$, the row where 1 exists at another row of the corresponding to the column group may be defined.

To be specific, in case of Table 3, $Q_{ldpc}=(N_{ldpc}-K_{ldpc})/M=(16200-14040)/360=6$, index of the row where 1 exists in the $0^{th}$ row of the $0^{th}$ column group is 237, 638, 1607, . . . and thus, index of the row where 1 exists in the 1st column of the $0^{th}$ column group may be 243(=237+6), 644(=638+6), 1613(=1607+6) and index of the row where 1 exists in the $2^{nd}$ column of the $0^{th}$ column group may be 249(=243+6), 650(=644+6), 1619(=1613+6).

As another example, when a length of the LDPC codeword $N_{ldpc}$ is 16200, a length of the information word $K_{ldpc}$ is 11880, code rate is 11/15, and M is 360, the parity check matrix may be defined as Table 4 shown below.

TABLE 4

Index of row where 1 is located in the $0^{th}$ column of ith column
i group 0 108 297 703 742 1345 1443 1495 1628 1812 2341 2559 2669 2810 2877 3442 3690 3755 3904 4264
1 180 211 477 788 824 1090 1272 1578 1685 1948 2050 2195 2233 2546 2757 2946 3147 3299 3544
2 627 741 1135 1157 1226 1333 1378 1427 1454 1696 1757 1772 2099 2208 2592 3354 3580 4066 4242
3 9 795 959 989 1006 1032 1135 1209 1382 1484 1703 1855 1985 2043 2629 2845 3136 3450 3742
4 230 413 801 829 1108 1170 1291 1759 1793 1827 1976 2000 2423 2466 2917 3010 3600 3782 4143
5 56 142 236 381 1050 1141 1372 1627 1985 2247 2340 3023 3434 3519 3957 4013 4142 4164 4279
6 298 1211 2548 3643
7 73 1070 1614 1748
8 1439 2141 3614
9 284 1564 2629
10 607 660 855
11 1195 2037 2753
12 49 1198 2562
13 296 1145 3540
14 1516 2315 2382
15 154 722 4016
16 759 2375 3825
17 162 194 1749
18 2335 2422 2632
19 6 1172 2583
20 726 1325 1428
21 985 2708 2769
22 255 2801 3181
23 2979 3720 4090
24 208 1428 4094
25 199 3743 3757
26 1229 2059 4282
27 458 1100 1387
28 1199 2481 3284
29 1161 1467 4060
30 959 3014 4144
31 2666 3960 4125
32 2809 3834 4318

Table 4 illustrates an index of the row where 1 exists in the $0^{th}$ column of the $i^{th}$ column group of the information word matrix of the parity check matrix.

In other words, the information word sub matrix may constitute of 33 column groups including 360 columns respectively, and position of 1 in the $0^{th}$ column of each column group may be defined by the aforementioned Table 4. For example, in case of $0^{th}$ column of $0^{th}$ column group, 1 may exist in $108^{th}$ row, $297^{th}$ row, and $703^{th}$ row, . . . .

In addition, by cyclic-shifting the row where 1 exists at $0^{th}$ row of each row group as much as $Q_{ldpc}$, the row where 1 exists at another row of the corresponding to the column group may be defined.

To be specific, in case of Table 4, $Q_{ldpc}=(N_{ldpc}-K_{ldpc})/M=(16200-11880)/360=12$, an index of row in which 1 is positioned at the $0^{th}$ column of the $0^{th}$ column group is 108, 297, 703, . . . , and thus, an index of the row where 1 exists in the $1^{st}$ column of the $0^{th}$ column group may be 120(=108+12), 309(=297+12), 715(=703+12), . . . , and an index of the row where 1 exists in the 2nd column of the $0^{th}$ column group may be 132(=120+12), 321(=309+12, 727(=715+12), . . . .

In that the parity check matrix defined in FIGS. 2-4 has the structure as shown in FIG. 4, the parity sub matrix may have a dual diagonal configuration.

After all, the configuration of the parity check matrix 400 may be defined according to the above-described method, and the information on the parity check matrix may be pre-stored.

As described above, a position in which at least one zero bits are padded may be determined by the parity check matrix which is used for the LDPC encoding.

To be specific, the zero padding unit 210 may locate the data on the BCH information word so that the data is assigned to a column group having the highest degree from among a plurality of column groups constituting the information word sub matrix, and locate remaining zero bits constituting the BCH information word, and pad zero bits to the data.

Herein, assigning the data to a column group indicates locating the data at a position in which a column group having the highest degree may be multiplied when generating a LDPC codeword by $H \cdot C^T = 0$.

For example, it may be assumed that the data is L1-pre signaling. In this case, the $0^{th}$ column group has the highest degree, and the BCH information word is $I = (i_0, i_1, \ldots, i_{K_{bch}-1})$. In this case, from among the bits constituting the BCH information word, $i_0, i_1, \ldots, i_{359}$ are multiplied with the $0^{th}$ column group of the information word sub matrix upon the LDPC encoding, and the L1-pre signaling may be positioned at the corresponding bits, and zero bits may be padded to at the remaining bits constituting the BCH information such as $i_{360}, i_{361}, \ldots, i_{K_{bch}-1}$.

Hereinbelow, a method of padding zero bits according to the structure of the parity check matrix will be further detailed.

First of all, the zero padding unit 210 categorizes the BCH information word into a plurality of groups. Here, the BCH information word may be generated by padding at least one zero bit to the data.

To be specific, the zero padding unit 210, based on Equation 4 shown below, categories the BCH information word $I = (i_0, i_1, \ldots i_{K_{bch}-1})$ constituting $K_{bch}$ bits into groups in the number of $N_{group}$.

$$Z_j = \left\{ i_k \middle| j = \left\lfloor \frac{k}{360} \right\rfloor, 0 \leq k < K_{bch} \right\} \quad \text{[Equation 4]}$$
$$\text{for } 0 \leq j < N_{group}$$

Herein, $Z_j$ indicates $j^{th}$ group. In addition, $\lfloor x \rfloor$ indicates the maximum integer which is less than x, for example, $\lfloor 1.2 \rfloor = 1$.

The BCH encoder 221 may BCH encode the BCH information word and generate the BCH codeword, and the LDPC encoder 222 may perform the LDPC coding with the BCH codeword as an LDPC information word, and generate an LDPC codeword. Herein, the BCH codeword may be a format where BCH parity bits are added to the BCH information word, and the LDPC codeword may be a format where the LDPC parity bits are added to the BCH codeword.

Figure 5:
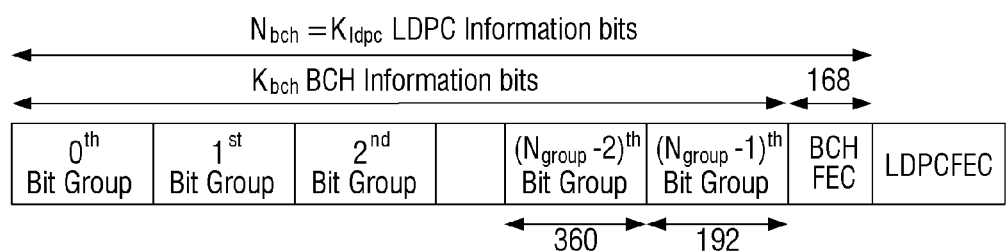
FIGS. 5-8 are views to describe a zero bits padding method according to an exemplary embodiment.

As described above, the LDPC codeword which is generated through concatenation of the BCH code and the LDPC code is illustrated in FIG. 5. Referring to FIG. 5, the BCH information word may be divided into the groups in the number of $N_{group}$, and it may be confirmed after the BCH information word, the BCH parity bits and the LDPC parity bits are sequentially added.

The coding parameters ($K_{bch}$, $K_{ldpc}$ which are different from each other according to a modulation method as shown in Table 5 may be applied and the LDPC codeword may be generated.

TABLE 5

| | $K_{bch}$ | $K_{ldpc}$ |
|---|---|---|
| BPSK | 13872 | 14040 |
| QPSK | 11712 | 11880 |

To be specific, when a modulation method is BPSK (binary phase shift keying), a length of the BCH information word $K_{bch}$ which is required for the BCH encoding is 13872, and the BCH parity bits constituting 168 bits are generated by the BCH encoding, and thus, a length of the LDPC information word $K_{ldpc}$ may be 14040.

In this case, the LDPC encoder 220, based on Table 2 or 3, may perform the LDPC encoding with respect to the LDPC information word with 13/15 code rate, and generate an LDPC codeword. The length of the LDPC codeword, $N_{ldpc}$, may be 16200.

In addition, when a modulation method is QPSK (quadrature phase shift keying), $K_{bch}$, a length of BCH information word which is required for BCH encoding, is 11712, and the BCH parity bits constituting of 169 bits are generated by BCH encoding, and thus, $K_{ldpc}$, a length of the LDPC information word, may be 11180.

In this case, the LDPC encoder 220, based on Table 4, may perform the LDPC encoding with respect to the LDPC information word with the 11/15 code rate, and generate an LDPC codeword. In this case, $N_{ldpc}$, a length of the LDPC codeword, may be 16200.

Referring to FIG. 5, when a modulation method is BPSK, $K_{bch}$, a length of the BCH information word, is 13872, and the number of the groups, $N_{group}$, which constitute the BCH information word may be 39. In this case, each group from the $0^{th}$ group to $N_{group} - 2^{nd}$ group constitutes of 360 bits respectively, and $N_{group} - 1_{st}$ group, that is, the last group constitutes of $360 - (K_{ldpc} - K_{bch}) = 360 - (14040 - 13872) = 192$ bits.

In addition, when a modulation method is QPSK, $K_{bch}$ which is a length of the BCH information word is 11712, and the number of groups, $N_{group}$, which constitute of the BCH information word may be 33. In this case, each group from the $0^{th}$ group to the $N_{group} - 2^{nd}$ group constitutes of 360 bits respectively, and the $N_{group} - 1^{st}$ group, that is, the last group constitutes of $360 - (K_{ldpc} - K_{bch}) = 360 - (11880 - 11712) = 192$ bits.

In other words, in the above cases, the group $Z_j$ which satisfies $0 \leq j \leq N_{group} - 2$ constitutes of 360 bits, and the group $Z_{N_{group}-1}$ constitutes of 192 bits.

When $N_{ldpc}$ which is a length of the LDPC codeword is 16200, $K_{ldpc}$ which is a length of the information word is 14040, and code rate is 13/15, the LDPC encoder 222, based on the parity check matrix defined by Table 2 or 3, may perform the LDPC encoding.

In this case, the zero padding unit 210 may determine a column group which has the highest degree from among the parity check matrix defined by Table 2 or 3, and may pad at least one zero bits so that the data is assigned to the corresponding column group.

Hereinbelow, with referring to FIG. 6, a method of padding zero bits when the LDPC encoding is performed by the parity check matrix defined by Table 2 is described. Meanwhile, it is assumed that the data to which zero bits are padded is L1-pre signaling in FIG. 6 for convenience of explanation.

A length of the L1-pre signaling is 200 which is a fixed value, and the zero padding unit 210 may pad zero bits which are equivalent to the value which subtracts $K_{sig}$, a length of the L1-pre signaling, from $K_{bch}$, a length of the BCH information word (herein, the zero padding unit 210 receives the L1-pre signaling and pads the zero bits, and $K_{sig}$ may be seen as the number of the information word bits which are input to the zero padding unit 210. In other words, the zero padding unit 210, as illustrated in FIG. 6, may pad zero bits in the number of $K_{bch}-K_{sig}=13872-200=13672$ to the L1-pre signaling and generate the BCH information word constituting of 13872 bits.

Referring to Table 2, it is seen that, from among 39 column groups constituting the information word sub matrix, the degree of the $0^{th}$ column group, $1^{st}$ column group, $2^{nd}$ column group, $3^{rd}$ column group, and $4^{th}$ column group is higher than that of other column groups.

The zero padding unit 210 may pad zero bits so that the L1-pre signaling is assigned to one of the five column groups. Hereinbelow, the case where the L1-pre signaling is assigned to the $0^{th}$ column group is assumed.

Figure 6:
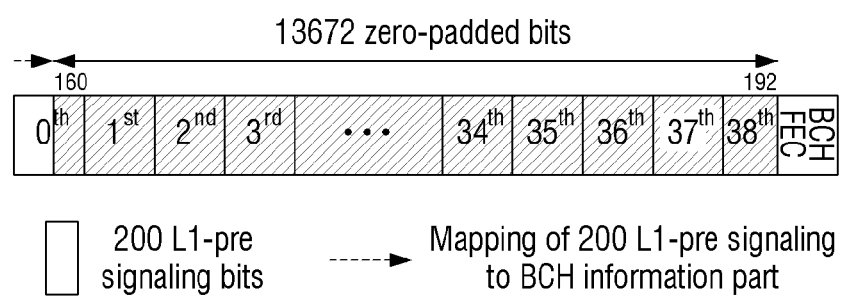

The BCH information word is categorized to 39 groups which are the same number as the column groups of the information word sub matrix, and each group of the BCH information word corresponds to each column group of the information word sub matrix (in this case, the last group consists of 192 bits and the BCH parity bits consist of 168 bits, so the last group may correspond to the last column group of the information word sub matrix along with the BCH parity bits), and thus, the zero padding unit 210, as illustrated in FIG. 6, may sequentially position the L1-pre signaling from the $0^{th}$ bit to the $199^{th}$ bit which constitute of the $0^{th}$ group of the BCH information word. Accordingly, the L1-pre signaling may be assigned to 200 columns of the $0^{th}$ column group of the parity check matrix (that is, from the $0^{th}$ column to the $199^{th}$ column of the $0^{th}$ column group of the information word sub matrix).

The zero padding unit 210 may pad zero bits to remaining bits, that is, from the $200^{th}$ bit to the $359^{th}$ bit of the $0^{th}$ group of the BCH information word, and may pad zero bits to the bits constituting from the $1^{st}$ group to the $38^{th}$ group of the BCH information word. In other words, the zero padding unit 210, as illustrated in FIG. 6, may pad 160 zero bits to the $0^{th}$ group and 13512 zero bits from the $1^{st}$ group to the $38^{th}$ group, and may pad 13672 zero bits in total.

When each bit constituting of the L1-pre signaling is ($s_0, s_1, \ldots, s_{199}$), the BCH information word may be composed of $I=(i_0, i_1, \ldots, i_{199}, i_{200}, i_{201}, \ldots, i_{K_{13871}})=(s_0, s_1, \ldots, s_{199}, 0, 0, \ldots, 0)$.

As described above, the zero padding unit 210, when the position where 1 exists within a plurality of column groups of the information word sub matrix is defined as Table 2, may pad at least one zero pads to the L1-pre signaling so that the L1-pre signaling is assigned to the $0^{th}$ column group from among a plurality of column groups. In this case, the encoder 220 may perform the LDPC encoding with 13/15 code rate, and generate an LDPC codeword constituting of 16200 bits.

In the above-described examples, it has been described that the L1-pre signaling is positioned between the $0^{th}$ bit to the $199^{th}$ bit of the $0^{th}$ group of the BCH information word, this is merely exemplary, and the L1-pre signaling may be positioned at other 200 bits of the $0^{th}$ column group.

In the above-described example, it has been explained that the L1-pre signaling is assigned to the $0^{th}$ column group from among 39 column groups constituting the information word sub matrix, but this is merely exemplary. That is, $3^{rd}$ the L1-pre signaling may be assigned to the $1^{st}$ column group, $2^{nd}$ column group, column group, and $4^{th}$ column group.

When $N_{ldpc}$ which is a length of the LDPC codeword is 16200, $K_{ldpc}$ which is a length of the information word is 14040, and code rate is 13/15, the LDPC encoder 222 may perform the LDPC encoding based on the parity check matrix defined by Table 3.

In this case, the zero padding unit 210 may determine the column group which has the highest degree from among the parity check matrix defined by Table 3, and pad at least one zero bits so that the data is assigned to the corresponding column group.

Figure 7:
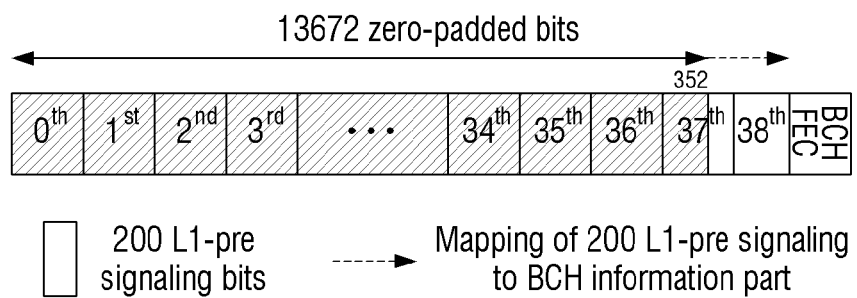

Herein, referring to FIG. 7, a method of padding zero bits when LDPC encoding is performed by the parity check matrix defined by Table 3 is described. Meanwhile, it is assumed that the data to which zero bits are padded is L1-pre signaling in FIG. 7 for convenience of explanation.

A length of the L1-pre signaling is 200 which is a fixed value, and the zero padding unit 210 may pad zero bits which are equivalent to the value which subtracts $K_{sig}$, a length of the L1-pre signaling, from $K_{bch}$, a length of the BCH information word. In other words, the zero padding unit 210, as illustrated in FIG. 7, may pad zero bits in the number of $K_{bch}-K_{sig}=13872-200=13672$ to the L1-pre signaling and generate the BCH information word constituting of 13872 bits.

Referring to Table 3, it is seen that, from among 39 column groups constituting the information word sub matrix, the degree of the $34^{th}$ column group, $35^{th}$ column group, $36^{th}$ column group, $37^{th}$ column group, and $38^{th}$ column group is higher than that of other column groups.

Therefore, the zero padding unit 210 may pad zero bits so that the L1-pre signaling is assigned to one of the five column groups.

Hereinbelow, it is assumed that the L1-pre signaling is assigned to the $38^{th}$ column group.

The BCH information word is categorized to 39 groups which are the same number as the column groups of the information word sub matrix, and each group of the BCH information word corresponds to each column group of the information word sub matrix (in this case, the last group consists of 192 bits and the BCH parity bits consist of 168 bits, so the last group may correspond to the last column group of the information word sub matrix along with the BCH parity bits), and thus, the zero padding unit 210, as illustrated in FIG. 7, may position the L1-pre signaling to the bits which constitute of the $38^{th}$ group, the last group, of the BCH information word.

Herein, the $38^{th}$ group constitutes of 192 bits, and thus, the zero padding unit 210 may position the L1-pre signaling to the entire bits constituting the $38^{th}$ group, and position L1-pre signaling of other 8 bits to the bits constituting the $37^{th}$ group.

To be specific, the zero padding unit 210 may sequentially position initial eight bits constituting the L1-pre signaling from the 352th bits to the $359^{th}$ bits of the $37^{th}$ group, and may sequentially position the L1-pre signaling of remaining 192 bits from $0^{th}$ bit to $359^{th}$ bit. Accordingly, the L1-pre signaling may be assigned from the $352^{th}$ column to the $359^{th}$ column of the $37^{th}$ column group of the parity check matrix (that is, from the $352^{th}$ column to the $359^{th}$ column of the $37^{th}$ column group of the information word sub matrix) and from the $0^{th}$ column to the $199^{th}$ column of the $38^{th}$ column of the parity check matrix (that is, from the $0^{th}$ column to the $199^{th}$ column of the $38^{th}$ column group of the information word sub matrix).

The zero padding unit 210 may pad zero bits to remaining bits, that is, from the $0^{th}$ bit to the $351^{st}$ bit of the $37^{th}$ group of the BCH information word, and may pad zero bits to the bits constituting from the $0^{th}$ group to the $36^{th}$ group of the BCH information word. In other words, the zero padding unit 210, as illustrated in FIG. 7, may pad 352 zero bits to the $37^{th}$ group and 13320 zero bits to the $37^{th}$ group, and may pad 13672 zero bits in total.

Consequently, when each bit constituting of the L1-pre signaling is $(s_0, s_1, \ldots, s_{199})$, the BCH information word may be composed of $I=(i_0, i_1, \ldots, i_{13670}, i_{13671}, i_{13672}, i_{13673}, \ldots, i_{K_{1387}})=(0, 0, \ldots, 0, 0, s_0, s_1, \ldots, s_{199})$.

As described above, the zero padding unit 210, when the position where 1 exists within a plurality of column groups of the information word sub matrix is defined as Table 3, may pad at least one zero pads to the L1-pre signaling so that the L1-pre signaling is assigned to the $38^{th}$ column group from among a plurality of column groups. In this case, the encoder 220 may perform the LDPC encoding with 13/15 code rate, and generate an LDPC codeword constituting of 16200 bits.

In the above-described examples, it has been described that the L1-pre signaling is positioned between the $37^{th}$ bit to the $352^{th}$ bit of the $37^{th}$ group of the BCH information word, this is merely exemplary, and the L1-pre signaling may be positioned at other 8 bits of the $37^{th}$ column group.

In the above-described example, it has been explained that the L1-pre signaling is assigned to the $38^{th}$ column group from among 39 column groups constituting the information word sub matrix, but this is merely exemplary. That is, the L1-pre signaling may be assigned to the $34^{th}$ column group, $35^{th}$ column group, $36^{th}$ column group, and $37^{th}$ column group which have the same degree as the 38th column group.

When $N_{ldpc}$ which is a length of the LDPC codeword is 16200, $K_{ldpc}$ which is a length of the information word is 11880, and code rate is 11/15, the LDPC encoder 222 may perform the LDPC encoding based on the parity check matrix defined by Table 4.

In this case, the zero padding unit 210 may determine the column group which has the highest degree from among the parity check matrix defined by Table 4, and pad at least one zero bits so that the data is assigned to the corresponding column group.

Hereinbelow, a method of padding zero bits when LDPC encoding is performed by the parity check matrix defined by Table 4 is described. Meanwhile, it is assumed that the data to which zero bits are padded is L1-pre signaling in FIG. 8 for convenience of explanation.

A length of the L1-pre signaling is 200 which is a fixed value, and the zero padding unit 210 may pad zero bits which are equivalent to the value which subtracts $K_{sig}$, a length of the L1-pre signaling, from $K_{bch}$, a length of the BCH information word. In other words, the zero padding unit 210, as illustrated in FIG. 8, may pad zero bits in the number of $K_{bch}-K_{sig}=11712-200=11512$ to the L1-pre signaling and generate the BCH information word constituting of 11712 bits.

Referring to Table 4, it is seen that, from among 33 column groups constituting the information word sub matrix, the degree of the $0^{th}$ column group, $1^{st}$ column group, $2^{nd}$ column group, $3^{rd}$ column group, $4^{th}$ column group, and $5^{th}$ column group is higher than that of other column groups.

Therefore, the zero padding unit 210 may pad zero bits so that the L1-pre signaling is assigned to one of the fix column groups. Hereinbelow, it is assumed that the L1-pre signaling is assigned to the $0^{th}$ column group.

Figure 8:
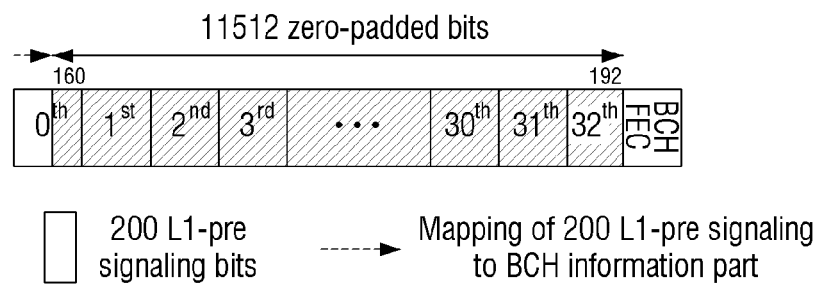

The BCH information word is categorized to 33 groups which are the same number as the column groups of the information word sub matrix, and each group of the BCH information word corresponds to each column group of the information word sub matrix (in this case, the last group consists of 192 bits and the BCH parity bits consist of 168 bits, so the last group may correspond to the last column group of the information word sub matrix along with the BCH parity bits), and thus, the zero padding unit 210, as illustrated in FIG. 8, may position the L1-pre signaling from the $0^{th}$ bit to the $199^{th}$ bit which constitute of the $0^{th}$ group of the BCH information word. Accordingly, the L1-pre signaling may be assigned to the 200 columns of the $0^{th}$ column of the parity check matrix (that is, from the $0^{th}$ column to the $199^{th}$ column of the $38^{th}$ column group of the information word sub matrix).

The zero padding unit 210 may pad zero bits to remaining bits, that is, from the $200^{th}$ bit to the $359^{th}$ bit of the $0^{th}$ group of the BCH information word, and may pad zero bits to the bits constituting from the $1^{st}$ group to the $32^{nd}$ group of the BCH information word. In other words, the zero padding unit 210, as illustrated in FIG. 8, may pad 160 zero bits to the $0^{th}$ group and 13512 zero bits from the $1^{st}$ group to the $32^{nd}$ group, and may pad 13672 zero bits in total.

Consequently, when each bit constituting of the L1-pre signaling is $(s_0, s_1, \ldots, s_{199})$, the BCH information word may be composed of $I=(i_0, i_1, \ldots, i_{199}, i_{200}, \ldots, i_{K_{1171}})=(s_0, s_1, \ldots, s_{199}, 0, 0, \ldots, 0)$.

As described above, the zero padding unit 210, when the position where 1 exists within a plurality of column groups of the information word sub matrix is defined as Table 4, may pad at least one zero pads to the L1-pre signaling so that the L1-pre signaling is assigned to the $0^{th}$ column group from among a plurality of column groups. In this case, the encoder 220 may perform the LDPC encoding with 11/15 code rate, and generate an LDPC codeword constituting of 16200 bits.

In the above-described examples, it has been described that the L1-pre signaling is positioned between the $0^{th}$ bit to the $199^{th}$ bit of the $0^{th}$ group of the BCH information word, this is merely exemplary, and the L1-pre signaling may be positioned at other 200 bits of the $0^{th}$ column group.

In the above-described example, it has been explained that the L1-pre signaling is assigned to the $0^{th}$ column group from among 33 column groups constituting the information word sub matrix, but this is merely exemplary. That is, 3rd the L1-pre signaling may be assigned to the $1^{st}$ column group, 2nd column group, column group, $4^{th}$ column group, and $5^{th}$ column group which have the same degree as the $0^{th}$ column group.

As described above, zero bits may be padded to the data so that the data may be assigned to a column group having the highest degree from among a plurality of column groups constituting the information word sub matrix. Accordingly, in that the data is multiplied by a column group having the higher degree during LDPC encoding, decoding of the data will be improved on the receiving end.

Figure 15:
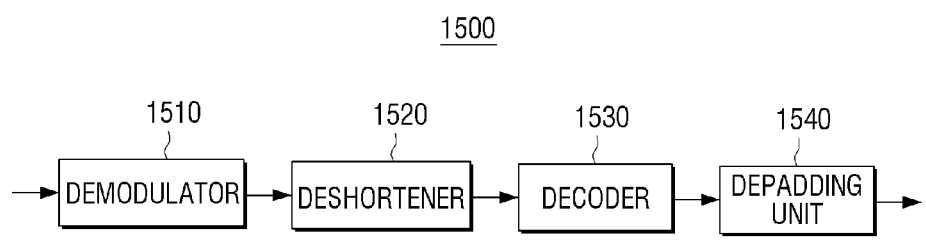
FIG. 15 is a block diagram to describe the configuration of a receiving apparatus according to an exemplary embodiment.

Meanwhile, the transmitting apparatus 200 may modulate the LDPC codeword which is output from the encoder 220 and output the codeword to the receiving apparatus (1500 of FIG. 15). To be specific, the transmitting apparatus 200 may map the LDPC codeword onto a constellation and generate a modulation symbol, and map the modulation symbol to the OFDM frame by using the OFDM method and transmit to the receiving apparatus 1500.

In this case, the at least one zero bits padded by the zero padding unit 210 may be removed and not transmitted to the receiving apparatus 1500, which is called shortening and the detailed description regarding shortening will be provided later.

Meanwhile, the information regarding the position of shortened bits may be predefined between the transmitting apparatus 200 and the receiving apparatus 1500. The transmitting apparatus 200 may transmit the information regarding the position of shortened bits to the receiving apparatus 1500 as signaling information, or may determine the position of shortened bits based on the parity check matrix which is used for LDPC encoding.

Figure 9:
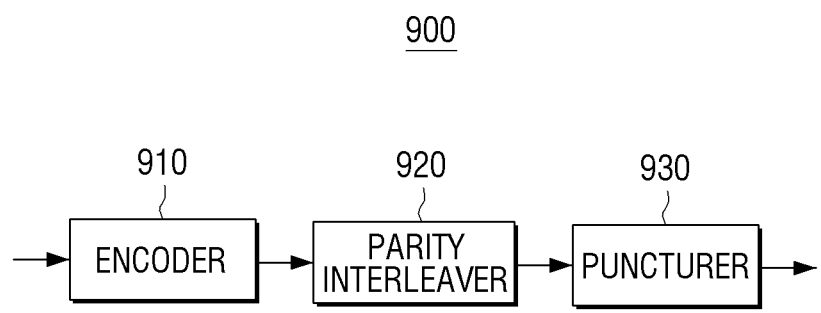
FIG. 9 is a block diagram to describe the configuration of a receiving apparatus according to an exemplary embodiment.

FIG. 9 is a block diagram to describe the configuration of a transmitting apparatus according to another exemplary embodiment. Referring to FIG. 9, a transmitting apparatus 900 includes an encoder 910, a parity interleaver 920, and a puncturer 930.

The encoder 910 performs LDPC encoding with respect to data which is input based on a parity check matrix. Here, the data may be L1-pre signaling, but is not limited thereto. The data may be L1-post signaling or broadcast data.

To do so, the encoder 910 may include an LDPC encoder (not illustrated).

Meanwhile, as the parity check matrix which is used for the LDPC encoding and the method for performing the LDPC encoding are the same as described in FIGS. 2 to 4 where the encoder 220 is described, further detailed description will not be provided.

Meanwhile, in the above-described example, the data which is input to the encoder 910 may be L1-pre signaling to which at least one zero bit is padded, and the encoder 910 may include a BCH encoder (not illustrated) and perform BCH and LDPC encoding sequentially. Likewise, the description regarding the encoder 910 is the same as that of the encoder 220 in FIGS. 2 to 4 and thus, further detailed description will not be provided.

As such, the encoder 910 may generate an LDPC codeword by performing LDPC encoding with respect to the input data.

For example, in response to $K_{ldpc}$ bits being input to the encoder 910, the encoder 910 may generate an LDPC codeword consisting of $N_{ldpc}$ bits by performing LDPC encoding with the input bits as an information word. In this case, the LDPC codeword may include an information word consisting of $K_{ldpc}$ bits and LDPC parity bits consisting of $N_{parity}(=N_{ldpc}-K_{ldpc})$ bits.

The parity interleaver 920 interleaves parity bits from among the LDPC codeword which is generated by the LDPC encoding. In other words, the parity interleaver 920 receives the LDPC codeword from the encoder 910, and performs interleaving with respect to LDPC parity bits from among the information word constituting the LDPC codeword and the LDPC parity bits.

To be specific, the parity interleaver 920 may interleave only the LDPC parity bits from among the LDPC codeword $C=(c_0, c_1, \ldots, c_{N_{ldpc}-1})$ output from the encoder 310, based on Equation 5, and output the parity-interleaved LDPC codeword $U=(u_0, u_1, \ldots, u_{N_{ldpc}-1})$ to the puncturer 930.

$$u_i = c_i \text{ for } 0 \le i < K_{ldpc}$$

$$u_{K_{ldpc}+M \cdot t+s} = c_{K_{ldpc}+Q_{ldpc} \cdot s+t} \text{ for } 0 \le s < M, 0 \le t < Q_{ldpc} \quad \text{[Equation 5]}$$

Herein, M is an interval in which patterns of columns are repeated in the information word sub matrix (for example, 360), $Q_{ldpc}$ is the size that each column is cyclic-shifted in the information word sub matrix, and $K_{ldpc}$ is the number of bits of the LDPC information word.

For example, if LDPC encoding is performed with the code rate of 13/15, $Q_{ldpc}$ is 6, and $K_{ldpc}$ is 14040, and if LDPC encoding is performed with the code rate of 11/15, $Q_{ldpc}$ is 12, and $K_{ldpc}$ is 11880.

The puncturer 930 may puncture at least a part of the interleaved-parity bits. In other words, the puncturer 930 may receive from the parity interleaver 920 the LDPC codeword where the LDPC parity bits are interleaved, and puncture at least a part of the LDPC parity bits constituting the LDPC codeword.

Here, puncturing means removing a part of parity bits and not transmitting the bits.

To be specific, the puncturer 930 may group parity bits based on an interval at which a pattern of columns is repeated in the information word sub matrix constituting a parity check matrix, and perform puncturing based on the number of punctured parity bits and the position of the punctured parity bit groups from among the groups of parity bits.

Here, the interval at which a pattern of columns is repeated in the information word sub matrix constituting the parity check matrix indicates the number of columns which belong to the same column group in the information word sub matrix, which may be represented as M as described above in FIG. 4, and the specific example may be M=360.

To do so, the puncturer 930 may group the LDPC parity bits based on the interval at which a pattern of columns is repeated in the information word sub matrix constituting the parity check matrix, and divide the LDPC parity bits into a plurality of parity bit groups.

To be specific, the puncturer 930 may divide the parity bits into a plurality of parity groups so that each parity bit group consists of the number of bits as many as the interval at which a pattern of columns is repeated in the information word sub matrix.

For example, the puncturer 930, based on Equation 6 shown below, may divide the LDPC parity bit ($u_{K_{ldpc}}$, $u_{K_{ldpc}+1}, \ldots, u_{N_{ldpc}-}$) consisting of $N_{ldpc}-K_{ldpc}$ bits to $Q_{ldpc}$ parity bit groups. In this case, each parity bit group may form a subset of the interleaved LDPC parity bits.

$$P_j = \left\{ u_k \middle| j = \left\lfloor \frac{k - K_{ldpc}}{360} \right\rfloor, K_{ldpc} \le k < N_{ldpc} \right\} \quad \text{[Equation 6]}$$

$$\text{for } 0 \le j < Q_{ldpc}$$

Herein, $P_j$ indicates $j^{th}$ parity bit group.

In addition, $N_{ldpc}$ indicates the length of the LDPC codeword, and $K_{ldpc}$ indicates the length of the information word. Further, $\lfloor x \rfloor$ means maximum integer which is less than x, for example, $\lfloor 1.2 \rfloor = 1$.

In the above equation, 360 (or M) indicates an interval at which a pattern of columns is repeated in the information word sub matrix, and $Q_{ldpc}$ indicates the size of each column which is cyclic-shifted in the information word sub matrix.

Figure 10:
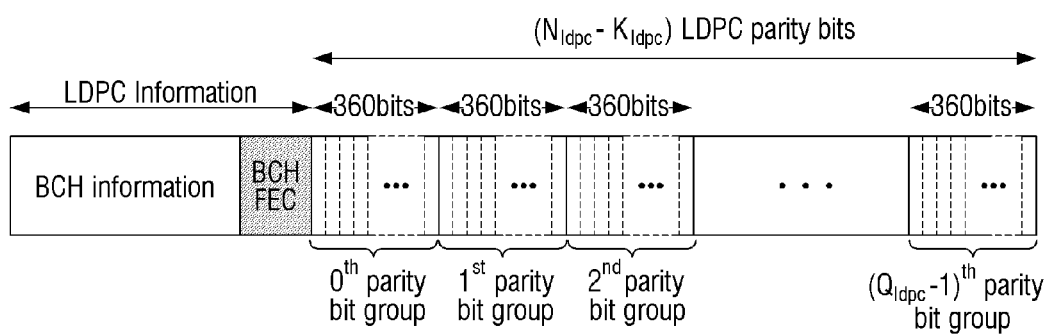
FIGS. 10-12 are views to describe a puncturing method according to an exemplary embodiment.

FIG. 10 illustrates that the LDPC parity bits are divided into a plurality of groups according to an exemplary embodiment. As illustrated in FIG. 10, the LDPC parity bits may be divided into the parity bit groups in the number of $Q_{ldpc}$, and each parity bit group may be composed of $360 = (N_{ldpc} - K_{ldpc})/Q_{ldpc}$ bits.

The puncturer 930 may determine the number of parity bits to be punctured. Herein, the number of parity bits to be punctured, $N_{punc}$, indicates the number of LDPC parity bits which are removed from the LDPC parity bits and thus, are not transmitted.

Figure 17:
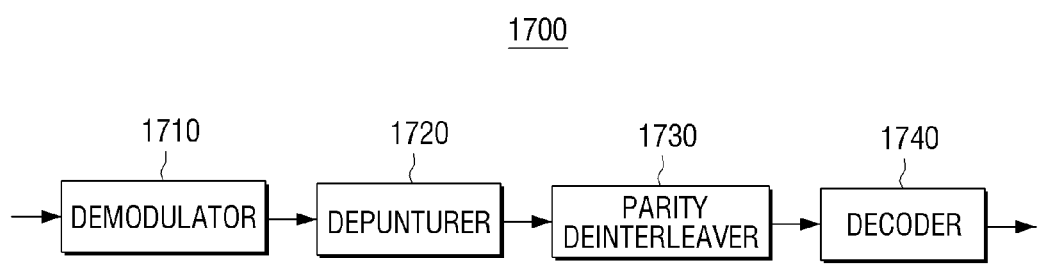
FIG. 17 is a block diagram to describe the configuration of a receiving apparatus according to an exemplary embodiment.

In this case, the number of parity bits to be punctured may be pre-defined between the transmitting apparatus 900 and the receiving apparatus (1700 of FIG. 17). Accordingly, the transmitting apparatus 900 may pre-store information regarding the number of parity bits to be punctured, and the puncturer 930 may determine the number of parity bits to be punctured based on the information.

Meanwhile, the transmitting apparatus 900 may transmit the information regarding the number of the punctured parity bits to the receiving apparatus 1700 as signaling information.

The puncturer 930 may determine the position of the parity bit groups to be punctured based on the pre-defined puncturing pattern and the number of parity bits to be punctured.

Herein, the pre-defined puncturing pattern indicates the order of the parity bit groups to be punctured. For example, if LDPC encoding is performed with the code rate of 11/15, the puncturing pattern may be defined as below in Table 6.

TABLE 6

| Code Rate | Order of parity group to be punctured, $\{\pi_p(j), 0 \le j < Q_{ldpc} = 12\}$ | | | | | |
|---|---|---|---|---|---|---|
| 11/15 | $\pi_p(0)$ 2 | $\pi_p(1)$ 7 | $\pi_p(2)$ 11 | $\pi_p(3)$ 4 | $\pi_p(4)$ 9 | $\pi_p(5)$ 5 |
| | $\pi_p(6)$ 0 | $\pi_p(7)$ 3 | $\pi_p(8)$ 8 | $\pi_p(9)$ 10 | $\pi_p(10)$ 1 | $\pi_p(11)$ 6 |

Herein, $\pi_p(j)$ indicates the index of the jth parity bit group to be punctured.

In other words, the puncturer 330 may perform puncturing in the order of 2($=\pi_p(0)$)nd parity bit group ($=P_2$), 7($=\pi_p(1)$)th parity bit group ($=P_7$), ..., 1($=\pi_p(10)$)st parity bit group ($=P_1$), and 6($=\pi_p(11)$)th parity bit group ($=P_6$) from among 12 parity bit groups ($P_0, P_1, P_2, \ldots, P_{10}, P_{11}$) in consideration of the number of parity bit groups to be punctured. For example, if the puncturer 930 punctures 2 parity bit groups, the $2^{nd}$ parity bit group and the $7^{th}$ parity bit group may be punctured from among 12 parity bit groups.

Meanwhile, the puncturer 930 may determine the number of parity bit groups to be punctured based on a value which is obtained by dividing the number of parity bits to be punctured by the interval at which a pattern of columns is respected in the information word sub matrix, and determine the position of parity bit groups to be punctured according to the determined number of parity groups and the pre-defined puncturing pattern.

To do so, the puncturer 930 may calculate $N_{punc\_group}$ based on the following Equation 7. Herein, $N_{punc\_group}$ indicates the number of parity bit groups which are punctured by group, that is, the number of parity bit groups where all bits in the corresponding parity bit group are punctured.

$$N_{punc\_groups} = \left\lfloor \frac{N_{punc}}{360} \right\rfloor \text{ for } 0 < N_{punc} < N_{ldpc} - K_{ldpc} \quad \text{[Equation 7]}$$

Herein, $N_{punc}$ indicates the number of parity bits to be punctured, $N_{ldpc}$ indicates the length of the LDPC codeword, and $K_{ldpc}$ indicates the length of the information word. In addition, in the above equation, 360 may be an example of an interval at which a pattern of columns is repeated in the information word sub matrix. Further, $\lfloor x \rfloor$ means maximum integer which is less than x, for example, $\lfloor 1.2 \rfloor = 1$.

If the number of parity bits to be punctured is exactly divided by the interval at which a pattern of columns is repeated without any remainder, the puncturer 930 may determine the quotient as the number of parity bit groups to be punctured, and may puncture the parity bit groups at the determined position by group according to the pre-defined puncturing pattern.

In other words, if the number of parity bits to be punctured is exactly divided by the interval at which a pattern of columns is repeated without any remainder, the puncturer 930 may determine that $N_{punc\_group}$ is the number of parity bit groups to be punctured, and may determine $\pi_p(0)$th group ($=P_{\pi_p(0)}$), $\pi_p(1)$th group ($=P_{\pi_p(1)}$), ..., $\pi_p(N_{punc\_group}-1)$th group $$(=P_{\pi_p(N_{punc\_group}-1)})$$

as the parity bit groups to be punctured based on the pre-defined puncturing pattern.

The puncturer 930 may puncture $\pi_p(0)$th parity bit group, $\pi_p(1)$th parity bit group, ..., $\pi_p(N_{punc\_group}-1)$th parity bit group by group. In other words, the puncturer 930 may puncture all parity bits included in each of $\pi_p(0)$th parity bit group, $\pi_p(1)$th parity bit group, ..., $\pi_p(N_{punc\_group}-1)$th parity bit group.

For example, it is assumed that $N_{punc}=720$, and the puncturing pattern is defined as shown in Table 6. In this case, the number of parity bits to be punctured is divided exactly by the interval at which a pattern of columns is repeated without any remainder, and the quotient becomes '2'.

Accordingly, the puncturer 930 may determine that 2 parity bit groups are to be punctured, and may determine the $2^{nd}$ parity bit group ($=P_2$) and the $7^{th}$ parity bit group ($=P_7$) as the parity bit groups to be punctured from among 12 parity bit groups ($P_0, P_1, \ldots, P_{10}, P_{11}$) based on the puncturing pattern as shown in Table 6. The puncturer 930 may puncture all LDPC parity bits in the $2^{nd}$ parity bit group and the $7^{th}$ parity bit group.

Meanwhile, if the number of parity bits to be punctured is not divided exactly by the interval at which a pattern of columns is repeated, the puncturer 930 may determine the value which is obtained by adding '1' to the quotient as the number of parity bit groups to be punctured, and may puncture at least a part of the parity bit groups at the determined position according to the pre-defined puncturing pattern.

In this case, if the quotient is '0', the puncturer 930 may puncture parity bits as many as the remainder which is obtained by dividing the number of parity bits to be punctured by the internal at which a pattern of columns is repeated at the parity bit groups at the determined position according to the pre-defined puncturing pattern.

In other words, if the number of parity bits to be punctured is not divided exactly by the interval at which a pattern of columns is repeated and the quotient is '0', the puncturer 930 may determine $N_{punc\_group}+1$ as the number of parity bit groups to be punctured, and may puncture a part of the $_p$ ($N_{punc\_group}$)th group $$(=P_{\pi_p(N_{punc\_group})})$$

from among the parity bit groups according to the pre-defined puncturing pattern.

In this case, the puncturer 930 may puncture the parity bits as many as the remainder which is obtained by dividing the number of parity bits to be punctured by the internal at which a pattern of columns is repeated at the $\pi_p$ ($N_{punc\_group}$)th group $$(=P_{\pi_p(N_{punc\_group})}).$$

For example, it is assumed that $N_{punc}=200$ and the puncturing pattern is defined as shown in Table 6. In this case, the number of parity bits to be punctured is not divided exactly by the interval at which a pattern of columns is repeated without any remainder, and the quotient becomes '0' and the remainder becomes '200'.

Accordingly, the puncturer 930 may determine that a part of one parity bit group is to be punctured, and may puncture the parity bits as many as the remainder of the $2^{nd}$ parity bit group ($=P_2$), that is, 200 bits, from among 12 parity bit groups ($P_0, P_1, \ldots, P_{10}, P_{11}$) based on the puncturing pattern as shown in Table 6.

Meanwhile, if the quotient is higher than '1', the puncturer 930 may puncture the parity bits as many as the remainder which is obtained by dividing the number of parity bits to be punctured by the internal at which a pattern of columns is repeated at the last parity group from among parity bit groups at the determined position according to the pre-defined puncturing pattern, and may puncture the remaining parity bit groups by group.

In other words, if the number of parity bits to be punctured is not divided exactly by the interval at which a pattern of columns is repeated and the quotient is higher than '1', the puncturer 930 may determine $N_{punc\_group}+1$ as the number of parity bit groups to be punctured, and may determine the $\pi_p(0)$th group ($=P_{\pi_p(0)}$), the $\pi_p(1)$th group ($=P_{\pi_p(1)}$), ..., the $\pi_p(N_{punc\_group}-1)$th group $$(=P_{\pi_p(N_{punc\_group}-1)}),$$

and the $\pi_p(N_{punc\_group})$th group $$(=P_{\pi_p(N_{punc\_group})})$$

from among the parity bit groups as the parity bit groups to be punctured based on the pre-defined puncturing pattern.

In this case, the puncturer 930 may perform puncturing by group with respect to the $\pi_p(0)$th group, the $\pi_p(1)$th group, ..., and the $\pi_p(N_{punc\_group}-1)$th group, and may puncture the parity bits as many as the remainder with respect to the $\pi_p(N_{punc\_group})$th group.

For example, it is assumed that $N_{punc}=800$, and the puncturing pattern is defined as shown in Table 6.

In this case, the number of parity bits to be punctured is not divided exactly by the interval at which a pattern of columns is repeated without any remainder, and the quotient becomes '2' and the remainder becomes '80'.

Accordingly, the puncturer 930 may determine that 3 parity bit groups are to be punctured, and based on the puncturing pattern as shown in Table 6, may determine the $2^{nd}$ parity bit group ($=P_2$), the $7^{th}$ parity bit group ($=P_7$), and the $11^{th}$ parity bit group ($=P_{11}$) as the parity bit groups to be punctured from among 12 parity bit groups ($P_0, P_1, \ldots, P_{10}, P_{11}$).

In this case, the puncturer 930 may puncture all LDPC parity bits included in the corresponding parity bit groups with respect to the $2^{nd}$ parity bit group and the $7^{th}$ parity bit group, and may puncture 80 bits in the $11^{th}$ parity bit group which is the last parity bit group from among the parity bit groups which are determined to be punctured.

As such, if the number of parity bits to be punctured is not divided exactly by the interval at which a pattern of columns is repeated, the parity bits as many as $N_{punc}-360\,N_{punc\_group}$ are punctured in the $\pi_p(N_{punc\_group})$th group $$(=P_{\pi_p(N_{punc\_group})}).$$

Meanwhile, the information regarding the position of the parity bit groups to be punctured and the number of bits to be punctured in the corresponding parity bit groups may be predefined between the transmitting apparatus 900 and the receiving apparatus 1700. In addition, the transmitting apparatus 900 may transmit the corresponding information to the receiving apparatus 1700 as signaling information, and the receiving apparatus 1700 may determine the position of the parity bit groups to be punctured and the number of bits to be punctured in the corresponding parity bit groups using the received information. Further, the receiving apparatus 1700 may pre-store information regarding the pre-defined parity pattern and the information regarding the number of parity bits to be punctured, and may determine the position of the parity bit groups to be punctured and the number of bits to be punctured in the corresponding parity bit groups using the information.

Figure 11:
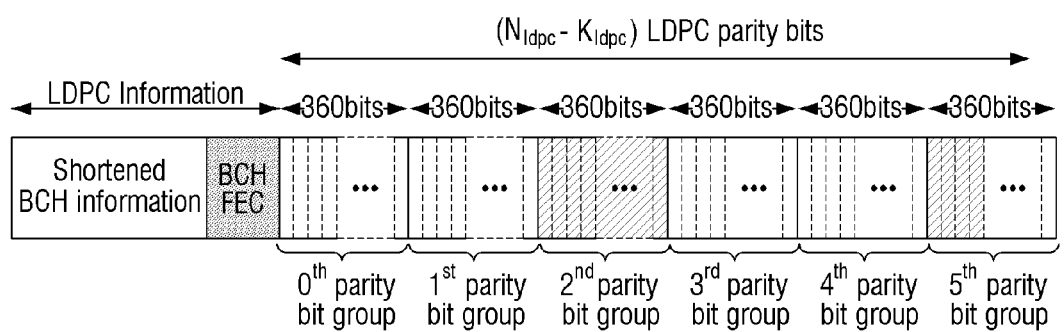
Figure 12:
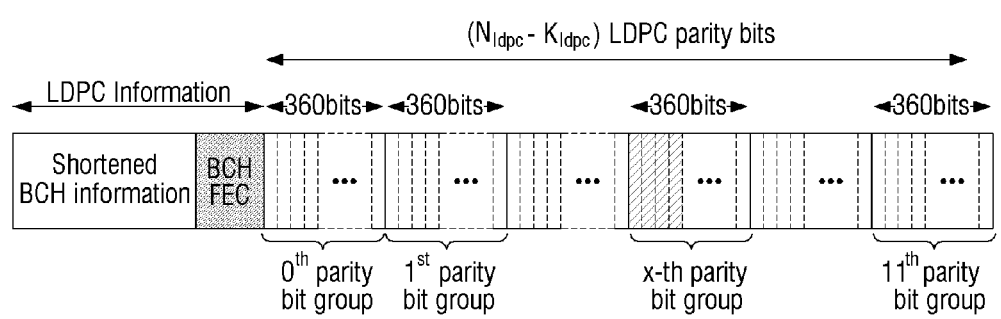

FIGS. 11 and 12 are views to describe a puncturing method according to an exemplary embodiment.

In FIG. 11, if the modulation method is BPSK, the encoder 910 generates an LDPC codeword consisting of 16200 bits by performing LDPC encoding with the code rate of 13/15. In this case, the LDPC parity bits consist of 2160 bits, and may be divided into 6 parity groups.

If the number of parity bits to be punctured is $N_{punc}=400$, the puncturer 930 may determine the $2^{nd}$ parity group ($=P_2$) and the $5^{th}$ parity group ($=P_5$) as the parity bit groups to be punctured based on the pre-defined puncturing pattern.

In addition, the puncturer 930 may puncture 40 bits from among 360 bits constituting the $2^{nd}$ parity bit group ($=P_2$) and 360 bits constituting the $5^{th}$ parity bit group ($=P_5$). In this case, the puncturer 930 may puncture 40 bits which are disposed at the front end of the $5^{th}$ parity bit group ($=P_5$).

In FIG. 12, if the modulation method is QPSK, the encoder 910 generates an LDPC codeword consisting of 16200 bits by performing LDPC encoding with the code rate of 11/15. In this case, the LDPC parity bits consist of 4320 bits, and may be divided into 12 parity groups.

If the number of parity bits to be punctured is $N_{punc}=264$, the puncturer 930 may determine the xth parity group ($=P_x$) as the parity bit groups to be punctured based on the pre-defined puncturing pattern.

In addition, the puncturer 930 may puncture 264 bits from among 360 bits constituting the xth parity bit group ($=P_x$). In this case, the puncturer 930 may puncture 264 bits which are disposed at the front end of the xth parity bit group ($=P_x$).

Meanwhile, the transmitting apparatus 900 may modulate the LDPC codeword output from the puncturer 930 and transmit the modulated LDPC code word to the receiving apparatus 1700. To be specific, the transmitting apparatus 900 may generate a modulation symbol by mapping and modulating the LDPC codeword bits at a constellation point, map the modulation symbol to an OFDM frame using an OFDM method, and transmit the symbol to the receiving apparatus 1700.

In this case, the parity bits which are punctured by the puncturer 930 are not transmitted to the receiving apparatus 1700.

Figure 13:
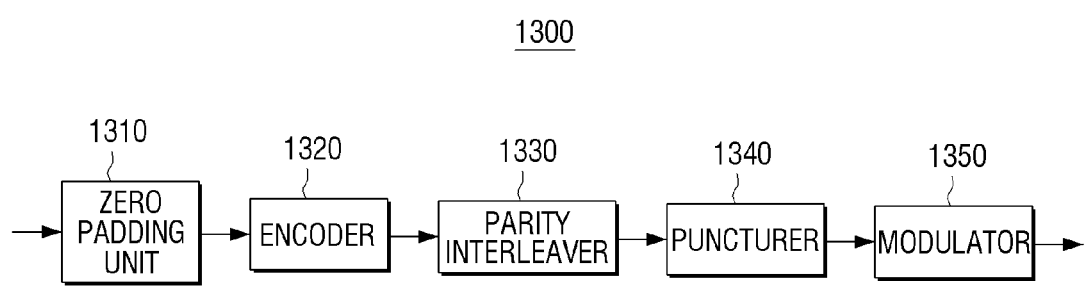
FIG. 13 is a block diagram to describe the detailed configuration of a transmitting apparatus according to an exemplary embodiment.

FIG. 13 is a block diagram to describe the detailed configuration of the transmitting apparatus according to an exemplary embodiment. Referring to FIG. 13, the transmitting apparatus 1300 includes a zero padding unit 1310, an encoder 1320, a parity interleaver 1330, a puncturer 1340, and a modulator 1350. Herein, the zero padding unit 1310 and the encoder 1320 may perform the same functions as the zero padding unit 210 and the encoder 220 as described in FIG. 2, and the encoder 1320, the parity interleaver 1330, and the puncturer 1340 may perform the same functions as the encoder 910, the parity interleaver 920, and the puncturer 930 as described in FIG. 9. Accordingly, further descriptions thereof will not be provided.

The zero padding unit 1310 may pad at least one zero bit to data to be input, and output the data where at least one zero bit is padded to the encoder 1320. Herein, the data may be L1-pre signaling, but is not limited thereto. The data may be L1-post signaling or broadcast data.

In this case, the zero padding unit 1310 may determine the position where the zero bit is padded based on a parity check matrix, which has been already described above.

The encoder 1320 generates an LDPC codeword by performing BCH and LDPC encoding with respect to the data where at least one zero pad is padded, and outputs the generated LDPC codeword to the parity interleaver 1330.

In this case, the encoder 1320 may perform LDPC encoding with various code rates based on a parity check matrix, which has been already described above.

The parity interleaver 1330 receives an LDPC codeword from the encoder 1320, performs interleaving with respect to LDPC parity bits constituting the LDPC codeword, and outputs the parity-interleaved LDPC codeword to the puncturer 1340.

In this case, the parity interleaver 1330 may perform interleaving with respect to the LDPC parity bits based on a specific rule, which has been already described above.

The puncturer 1340 may puncture at least a part of the LDDPC parity bits constituting the LDPC codeword.

To be specific, the puncturer 1340 may group the parity bits based on the interval at which a pattern of columns is repeated in the information word sub matrix constituting the parity check matrix, and may perform puncturing based on the number of parity bits to be punctured and the position of the parity bit groups to be punctured from among the grouped parity bit groups, which has been already described above.

The puncturer 1340 may remove at least one zero bits padded by the zero padding unit 1310. In this case, shortening means the zero bits which have been padded before encoding are removed after encoding, and the padded zero are not transmitted by the shortening.

To be specific, the puncturer 1340 may remove the zero bits (in the number of $K_{bch}-K_{sig}$) padded by the zero padding unit 1310.

Figure 14:
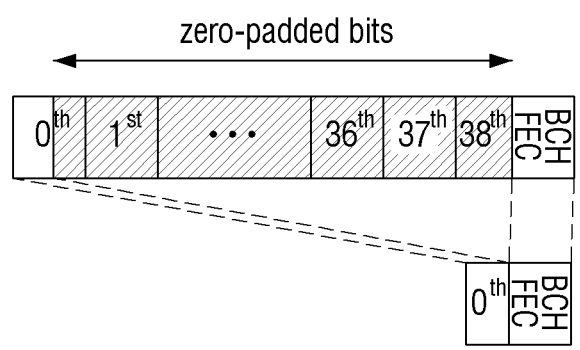
FIG. 14 is a view to describe a shortening method according to an exemplary embodiment.

For example, when zero bits are padded by the method illustrated in FIG. 6, the puncturer 1340, as illustrated in FIG. 14, may remove 13672 zero bits which are padded between the L1-pre signaling and the BCH parity bits. Accordingly, the information word constituting of $K_{sig}$ bits (that is, the L1-pre signaling constituting of $K_{sig}$ bits), the BCH parity bits constituting of 168 bits, and the LDPC parity bits constituting of the ($N_{ldpc}-K_{ldpc}-N_{punc}$) bits only remain. Herein, $N_{punc}$ indicates the number of punctured parity bits.

Figure 18:
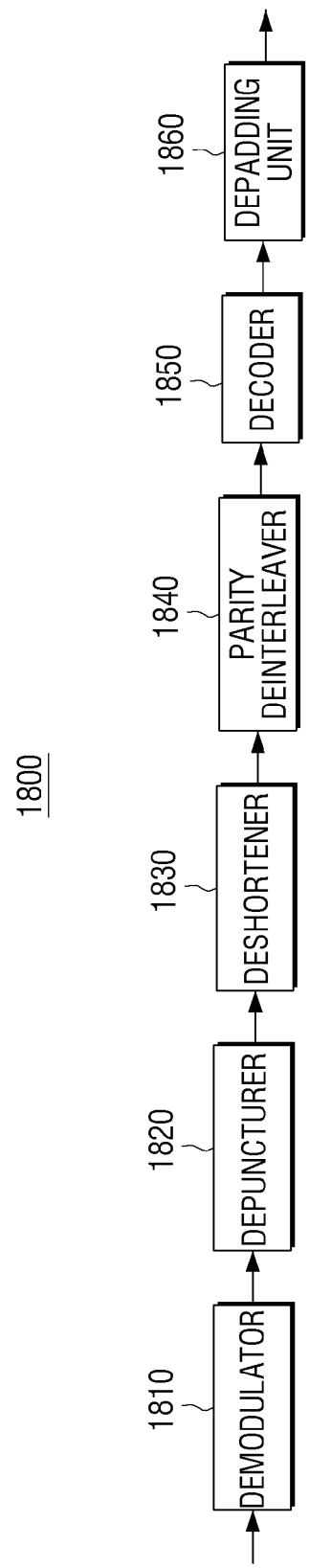
FIG. 18 is a block diagram to describe the detailed configuration of a receiving apparatus according to an exemplary embodiment.

Meanwhile, the information regarding the position of the shortened bits may be pre-defined between the transmitting apparatus 1300 and the receiving apparatus (1800 of FIG. 18). In addition, the transmitting apparatus 1300 may transmit the information regarding the position of the shortened bits to the receiving apparatus 1900 as signaling information, or the receiving apparatus 1800 may determine the position of the shortened bits based on the parity check matrix which is used for LDPC encoding.

As described above, the puncturer 1340 may puncture at least a part of the LDPC parity bits and remove the at least one zero bits padded by the zero padding unit 1310, and output the bits to the modulator 1350.

The modulator 1350 may modulate the LDPC codeword which is output from the puncturer 1340.

To be specific, the modulator 1350 may perform bit-to-cell conversion with respect to the LDPC codeword which is output from the puncturer 1340, and demultiplex the LDPC codeword to the cells having the preset number of bits or data cells.

For example, the modulator 1350 may sequentially output the LDPC codeword bits which are output from the puncturer 1340 to one of a plurality of sub streams, convert and output the LDPC codeword bits to cells. In this case, bits having the same index in each of a plurality of sub streams may constitute of the same cells.

Herein, the number of sub streams is the same as the number of bits which constitute of cells. For example, when the modulation method is QPSK, the number of sub streams may be two respectively, and the number of cells may be $N_{L1data}/2$ respectively. Herein, $N_{L1data}$ indicates the bit numbers of the LDPC codeword, that is, the bit numbers of the punctured and shortened LDPC codeword.

The modulator 1350, when the modulation method is BPSK, may not perform demultiplexing, since, in case when the modulation method is BPSK, a cell is composed of 1 bit.

The modulator 1350 may modulate cells. To be specific, the modulator may modulate the cells by mapping the cells onto constellation points by using various modulation methods such as BPSK and QPSK. Herein, when the modulation method is BPSK, QPSK, the number of bits constituting the modulation symbol (that is, the modulated cells) may be 1 and 2 respectively.

The transmitting apparatus 1300 may transmit the modulation symbol to a receiving apparatus 1800. For example, the transmitting apparatus 1300 may map the modulation symbol onto the OFDM frame and may transmit the frame to the receiving apparatus 1800 via an allocated channel. In this case, if the data is L1-pre signaling, the modulation symbol of the L1-pre signaling may be mapped onto the preamble symbol of the OFDM frame.

FIG. 15 is a block diagram to describe the configuration of a receiving apparatus according to an exemplary embodiment. According to FIG. 15, the receiving apparatus 1500 includes a demodulator 1510, a deshortener 1520, a decoder 1530, and a depadding unit 1540.

The demodulator 1510 receives and demodulates a signal transmitted from the transmitting apparatus 200. To be specific, the demodulator 1510 may generate a value corresponding to an LDPC codeword by demodulating the received signal, and may output the value to the deshortener 1520.

Here, the value corresponding to the LDPC codeword may be expressed as a channel value. There are various methods for determining the channel value, and for example, a method for determining a log likelihood ratio (LLR) may be the method for determining the channel value.

The LLR value is a log value for a ratio of the probability that the bit transmitted from the transmitting apparatus 200 is 0 and the probability that the bit is 1. In addition, the LLR value may be a bit value which is determined by hard decision, or may be a representative value which is determined according to a section to which the probability that the bit transmitted from the transmitting apparatus 200 is 0 or 1 belongs.

The LDPC codeword may be generated from encoded data which is positioned in the predetermined position according to the parity check matrix which is used for LDPC encoding in the transmitting apparatus 200.

Herein, the parity check matrix may include the information word sub matrix and the parity sub matrix, and the information word sub matrix may be composed of a plurality of column groups which include 360 columns respectively. For example, the parity check matrix has the structure as shown in FIG. 4, and the information word sub matrix may be defined as FIGS. 2-4, and the parity sub matrix may have a dual diagonal configuration.

To be specific, the LDPC codeword may be generated from the at least one zero bits which are padded to the data so that the data is assigned to a column group having a highest degree from among a plurality of column groups constituting of the information word sub matrix, and from the data to which the at least one zero bits are padded is encoded.

For example, when position where 1 exists from among a plurality of column groups of the information word sub matrix is defined as in the Table 2, the LDPC codeword may be generated from at least one zero bits which are padded to the data so that the data is assigned to $0^{th}$ column group from among a plurality of column groups, and from the data to which the at least one bits are padded is encoded. In this case, the LDPC codeword may be constitute of 16200 bits and may be encoded and generated with 13/15 code rate.

As another example, when the position where 1 exists in a plurality of column groups of the information word sub matrix is defined as in the Table 3, the LDPC codeword may be generated from the encoded data to which at least one zero bits are padded so that data is assigned to the $38^{th}$ column group from among a plurality of column groups. In this case, the LDPC codeword may be composed of 16200 bits, and encoded and generated with 13/15 code rate.

As a still another example, when position where 1 exists from among a plurality of column groups of the information word sub matrix is defined as in the Table 4, the LDPC codeword may be generated from the at least one zero bits which are padded to the data so that the data is assigned to the $0^{th}$ column group from among a plurality of column groups, and the zero bit padded data is encoded. In this case, the LDPC codeword may be composed of 16200 bits and be encoded and generated with 11/15 code rate.

Meanwhile, a method for generating the LDPC codeword regarding which the data is positioned in a preset position has been described above with respect to the transmitting apparatus 200.

The deshortener 1520 deshortens an output value of the demodulator 1510 and outputs to the decoder 1530.

To be specific, the deshortener 1520 may add to a value corresponding to the LDPC codeword a value which corresponds to the at least one zero bits which were removed from the transmitting apparatus 200.

That is, the deshortener 1520, based on the information such as position and the number of bits of the shortened zero bits and the number and value of bits, may add the LLR value which corresponds to the shortened zero bits to the LLR value which is output from the demodulator 1410. Herein, the LLR values corresponding to the shortened zero bits may be +∞ or −∞, but are not limited thereto. the LLR values corresponding to the shortened zero bits may be a maximum value or a minimum value of LLR which is allowed in a receiving system.

Meanwhile, the information regarding the position and the number of bits of the shortened zero bits may be provided by the transmitting apparatus 200, or may be pre-stored in the receiving apparatus 1500. Alternatively, the deshortener 1520 may determine the position where a zero bit is padded and the number of zero bits according to the code rate and the parity check matrix by applying the rule which is used for zero padding in the zero padding unit 210.

The decoder 1530 performs decoding using an output value of the deshortener 1520. In other words, the decoder 1530 may perform LDPC and BCH decoding based on a value corresponding to the LDPC codeword to which a value which corresponds to at least one zero bits is added.

Figure 16:
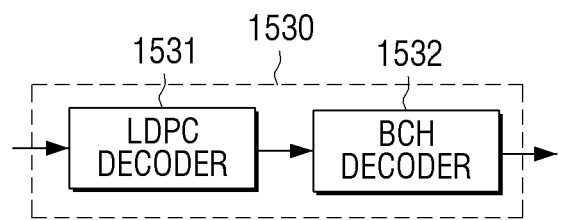
FIG. 16 is a block diagram to describe the configuration of a decoder according to an exemplary embodiment.

The decoder 1530, as illustrated in FIG. 16, may include an LDPC decoder 1531 and a BCH decoder 1532.

To be specific, the LDPC decoder 1531 may perform LDPC decoding using the LLR value which is output from the deshortener 1520.

For example, the LDPC decoder 1531 may perform the LDPC decoding in an iterative decoding method based on a sum-product algorithm. Herein, the sum-product algorithm is one example of a message passing algorithm, and the message passing algorithm refers to an algorithm which exchanges messages (e.g., LLR value) through an edge on a bipartite graph, calculates an output message from messages input to variable nodes or check nodes, and updates.

Meanwhile, the parity check matrix which is used for the LDPC decoding may have the structure as illustrated in FIG. 4, the information word sub matrix of the parity check matrix may be defined as Tables 2-4, and the parity sub matrix may have dual diagonal structure. The receiving apparatus 1500 may have the prestored information on the parity check matrix.

Then, the BCH decoder 1532 performs the BCH decoding with respect to the output value of the LDPC decoder 1531.

Herein, the output value of the LDPC decoder 1531 is composed of the data, zero bits padded to the data, and the BCH parity bits, and thus, the BCH decoder 1532 may correct errors using the BCH parity bits and output the data and the zero bits padded to the data to the depadding unit 1540.

Meanwhile, the information on the coding parameter which is used for decoding may be prestored in the receiving apparatus 1500 or be received from the transmitting apparatus 200.

The depadding unit 1540 may depad the zero bits padded to the data. Accordingly, the zero bits may be removed and the data which is transmitted from the transmitting apparatus 200 may be restored.

In other words, the transmitting apparatus 200, when the parity check matrix is defined as Tables 2-4, pads the zero bits so that the data is assigned to a column group having a highest degree from among a plurality of column groups constituting the information word sub matrix.

Accordingly, the depadding unit 1540, based on the position and the number of bits where the zero bits are padded in the transmitting apparatus 200, may remove the at least one zero bits which are padded to the data.

In this case, information on the position and the number of bits where the zero bits are padded may be prestored in the receiving apparatus 1500 or received from the transmitting apparatus 200. Further, the depadding unit 1540 may determine the position and the number of bits where the zero bits are padded according to the code rate and the parity check matrix by applying a rule which is used for zero padding in the zero padding unit 210.

FIG. 17 is a block diagram to describe the configuration of a receiving apparatus according to an exemplary embodiment. Referring to FIG. 17, the receiving apparatus 1700 includes a demodulator 1710, a depuncturer 1720, a parity interleaver 1730, and a decoder 1740.

The demodulator 1710 receives and demodulates a signal which is transmitted from the transmitting apparatus 900. To be specific, the demodulator 1710 may generate a value corresponding to the LDPC codeword by demodulating the received signal, and output the value to the depuncturer 1720.

Herein, the value corresponding to the LDPC codeword may be represented as a channel value. The method for determining the channel value may vary, and an example may be the method for determining an LLR value.

Herein, the LLR value is a log value for a ratio of the probability that the bit transmitted from the transmitting apparatus 200 is 0 and the probability that the bit is 1. In addition, the LLR value may be a bit value which is determined by hard decision, or may be a representative value which is determined according to a section to which the probability that the bit transmitted from the transmitting apparatus 200 is 0 or 1 belongs.

The depuncturer 1720 adds a specific value to the output value of the demodulator 1710, and outputs it to the parity deinterleaver 1730.

To be specific, the depuncturer 1720 which is an element corresponding to the puncturer 930 of the transmitting apparatus 900 performs an operation corresponding to the puncturer 930.

To do so, the depuncturer 1720 may determine the number of parity bits which are punctured by the puncturer 930.

In this case, the number of the parity bits to be punctured may be pre-defined between the transmitting apparatus 900 and the receiving apparatus 1700. Accordingly, the transmitting apparatus 1700 may pre-store the information regarding the number of parity bits to be punctured, and the depuncturer 1720 may determine the number of the parity bits which are punctured by the puncturer 930 using the information. Meanwhile, the transmitting apparatus 900 may transmit the information regarding the number of the punctured parity bits to the receiving apparatus 1700 as signaling information. In this case, the depuncturer 1720 may determine the number of parity bits which are punctured by the puncturer 930 using the received information.

In addition, the depuncturer 1720 may determine the position of the punctured parity bit groups and the number of the punctured bits in the corresponding parity bit groups based on the pre-defined puncturing pattern and the number of the punctured parity bits.

In other words, the depuncturer 1720 may determine the position of the punctured parity bit groups and the number of the punctured bits in the corresponding parity bit groups by using the method of determining the position of the punctured parity bit groups and the number of the punctured bits in the corresponding parity bit groups which is used in the puncturer 930, which has been already described in detail with respect to the transmitting apparatus 900.

Subsequently, the depuncturer 1720 may add a specific value to the output value of the demodulator 1710 based on the position of the punctured parity bit groups and the number of the punctured bits in the corresponding parity bit groups.

In other words, the depuncturer 1720 may insert an LLR value as many as the number of the punctured bits in the corresponding parity bit groups to the position of the punctured parity bit groups. Herein, the LLR value corresponding to the punctured bits may be '0'.

Meanwhile, in the above exemplary embodiment, the depuncturer 1720 calculates the position of the punctured parity bit groups and the number of the punctured bits in the corresponding parity bit groups, but this is only an example. The corresponding information may be pre-stored in the receiving apparatus 1700 or may be provided by the transmitting apparatus 900.

The parity deinterleaver 1730 performs parity deinterleaving with respect to the output value of the depuncturer 1720, and outputs it to the decoder 1740.

To be specific, the parity deinterleaver 1730 which is an element corresponding to the parity interleaver 920 of the transmitting apparatus 900 performs an operation corresponding to the parity interleaver 920.

In other words, the parity deinterleaver 1730 inversely performs an interleaving operation which is performed by the parity interleaver 920 so as to deinterleave an LLR value corresponding to the LDPC parity bits from among the LLR values output from the depuncturer 920. However, the parity deinterleaver 1730 of the receiving apparatus 1700 may be omitted according to decoding method and operation of the decoder 1740.

The decoder 1740 performs decoding using the output value of the parity deinterleaver 1730.

To do so, the decoder 1740 may further include an LDPC decoder (not shown), and may further include a BCH decoder (not shown) depending on circumstances.

To be specific, the decoder 1740 may perform LDPC decoding using an LLR value output from the parity deinterleaver 1730. For example, the decoder 1740 may resotre data which is transmitted from the transmitting apparatus 900 by performing LDPC decoding using iterative decoding based on sum-product algorithm.

Meanwhile, the parity check matrix which is used for LDPC decoding may have the structure as illustrated in FIG. 4. For example, the information word sub matrix of the parity check matrix may be defined as shown in Tables 2 to 4, and the parity sub matrix may have a double opposite angle structure. The receiving apparatus 1700 may pre-store information regarding the parity check matrix. FIG. 18 is a block diagram to describe the detailed configuration of a receiving apparatus according to an exemplary embodiment. Referring to FIG. 18, the receiving apparatus 1800 includes a demodulator 1810, a depuncturer 1820, a deshortener 1830, a parity interleaver 1840, a decoder 1850, and a depadding unit 1860.

Herein, the demodulator 1810, the deshortener 1830, the decoder 1850, and the depadding unit 1860 may perform the same functions as the demodulator 1510, the deshortener 1520, the decoder 1530, and the depadding unit 1540 as described in FIG. 15, and the demodulator 1810, the depuncturer 1820, the parity interleaver 1840, and the decoder 1850 may perform the same functions as the demodulator 1710, the depuncturer 1720, the parity deinterleaver 1730, and the decoder 1740 as described in FIG. 17. Accordingly further description thereof will not be provided.

The demodulator 1810 may generate a value corresponding to the LDPC codeword by receiving and demodulating a signal which is transmitted from the transmitting apparatus 1300, and output the value to the depuncturer 1820.

The depuncturer 1820 depunctures the output value of the demodulator 1810 and output to the deshortener 1830.

To be specific, the depuncturer 1820 which is an element corresponding to the puncturer 1340 of the transmitting apparatus 1300 performs an operation corresponding to the puncturer 1340.

To do so, the depuncturer 1820 may determine the number of parity bits which are punctured by the puncturer 1340.

In this case, the number of the parity bits to be punctured may be pre-defined between the transmitting apparatus 1300 and the receiving apparatus 1800. Accordingly, the receiving apparatus 1800 may pre-store the information regarding the number of parity bits to be punctured, and the depuncturer 1820 may determine the number of the parity bits which are punctured by the puncturer 1340 using the information. Meanwhile, the transmitting apparatus 1300 may transmit the information regarding the number of the punctured parity bits to the receiving apparatus 1800 as signaling information. In this case, the depuncturer 1820 may determine the number of the parity bits which are punctured by the puncturer 1340 using the received information.

In addition, the depuncturer 1820 may determine the position of the punctured parity bit groups and the number of the punctured parity bits in the corresponding parity bit groups based on the pre-defined puncturing pattern and the number of the punctured parity bits.

In other words, the depuncturer 1820 may determine the position of the punctured parity bit groups and the number of the punctured bits in the corresponding parity bit groups by using the method of determining the position of the punctured parity bit groups and the number of the punctured bits in the corresponding parity bit groups which is used in the puncturer 1340, which has been already described above in detail.

Subsequently, the depuncturer 1820 may add a specific value to the output value of the demodulator 1810 based on the position of the punctured parity bit groups and the number of the punctured bits in the corresponding parity bit groups.

In other words, the depuncturer 1820 may insert an LLR value as many as the number of the punctured bits in the corresponding parity bit groups to the position of the punctured parity bit groups. Herein, the LLR value corresponding to the punctured bits may be '0'.

Meanwhile, in the above exemplary embodiment, the depuncturer 1820 calculates the position of the punctured parity bit groups and the number of the punctured bits in the corresponding parity bit groups, but this is only an example. The corresponding information may be pre-stored in the receiving apparatus 1800 or may be provided by the transmitting apparatus 1300.

The deshortener 1830 deshortens the output value of the depuncturer 1820 and output it to the parity deinterleaver 1840.

To be specific, the deshortener 1830 may add a value corresponding to at least one zero bit which is removed from the transmitting apparatus 100 to the value corresponding to the LDPC codeword.

In other words, the deshortener 1830, based on the information such as position and the number of bits of the shortened zero bits and the number and value of bits, may add the LLR value which corresponds to the shortened zero bits to the LLR value which is output from the depuncturer 1820. Herein, the LLR values corresponding to the shortened zero bits may be $+\infty$ or $-\infty$, but are not limited thereto. The LLR values corresponding to the shortened zero bits may be a maximum value or a minimum value of LLR which is allowed in a receiving system.

Meanwhile, the information regarding the position and the number of bits of the shortened zero bits may be provided by the transmitting apparatus 1300, or may be pre-stored in the receiving apparatus 1800. Alternatively, the deshortener 1520 may determine the position where a zero bit is padded and the number of zero bits according to the code rate and the parity check matrix by applying the rule which is used for zero padding in the zero padding unit 1310.

The parity deinterleaver 1840 performs deinterleaving with respect to the output value of the deshortener 1830, and outputs it to the decoder 1850.

To be specific, the parity deinterleaver 1840 which is an element corresponding to the parity interleaver 1330 of the transmitting apparatus 1300 performs an operation corresponding to the parity interleaver 1330.

In other words, the parity deinterleaver 1830 inversely performs an interleaving operation which is performed by the parity interleaver 1330 so as to deinterleave an LLR value corresponding to the LDPC parity bits from among the LLR values output from the deshortener 1830. However, the parity deinterleaver 1840 of the receiving apparatus 1800 may be omitted according to decoding method and operation of the decoder 1850.

The decoder 1850 performs decoding using the output value of the parity deinterleaver 1840.

To do so, the decoder 1850 may further include an LDPC decoder (not shown), and may further include a BCH decoder (not shown).

In other words, the LDPC decoder (not shown) may perform LDPC decoding using the LLR value output from the parity deinterleaver 1840. For example, the LDPC decoder (not shown) may perform LDPC decoding using iterative decoding based on sum-product algorithm.

Meanwhile, the parity check matrix which is used for LDPC decoding may have the structure as illustrated in FIG. 4. For example, the information word sub matrix of the parity check matrix may be defined as shown in Tables 2 to 4, and the parity sub matrix may have a double opposite angle structure. The receiving apparatus 1800 may pre-store information regarding the parity check matrix.

Subsequently, the BCH decoder (not shown) performs BCH decoding with respect to the output value of the LDPC decoder (not shown).

Herein, as the output value of the LDPC decoder (not shown) consists of data, zero bits which are padded to the data, and BCH parity bits, the BCH decoder (not shown) may corrects errors using the BCH parity bits, and output the data and the zero bits padded to the data to the depadding unit 1860.

Meanwhile, the information regarding a coding parameter which is used for decoding may be pre-stored in the receiving apparatus 1800, or may be provided by the transmitting apparatus 1300.

The depadding unit 1860 may depad the zero bits padded to the data. Accordingly, the zero bits may be removed, and the data transmitted from the transmitting apparatus 1300 may be restored.

In other words, if the parity check matrix is defined as shown in Tables 2 to 4, the transmitting apparatus 1300 pads zero bits such that the data is assigned to a column group having the highest degree from among a plurality of column groups constituting the information word sub matrix.

Accordingly, the depadding unit 1860 may remove at least one zero bit which is padded to the data based on the position where the zero bits are padded in the transmitting apparatus 1300 and the number of bits.

In this case, the information regarding the position and the number of bits where the zero bits are padded may be pre-stored in the receiving apparatus 1800, or may be provided by the transmitting apparatus 1300. Alternatively, the depadding unit 1860 may determine the position and the number of bits where zero bits are padded according to the code rate and the parity check matrix by applying a rule which is used for zero padding in the zero padding unit 1310.

Figure 19:
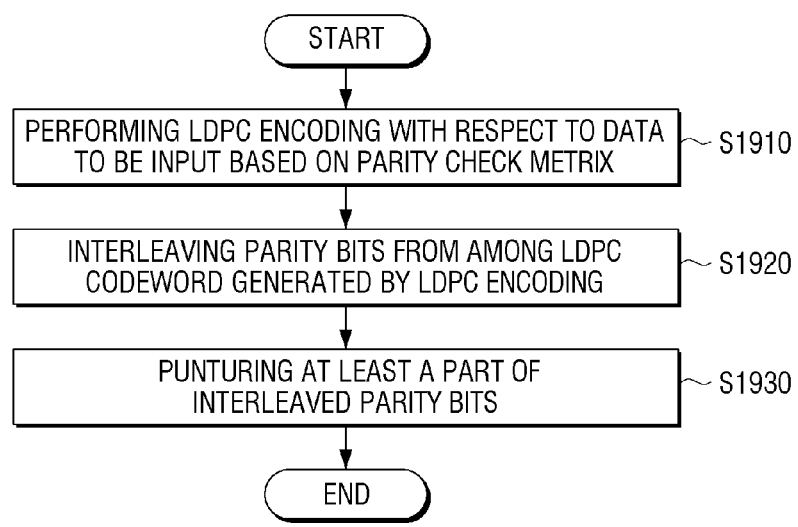
FIG. 19 is a flow chart to describe a puncturing method of a transmitting apparatus according to an exemplary embodiment.

FIG. 19 is a flow chart to describe a zero puncturing method of a transmitting apparatus according to an exemplary embodiment.

First of all, based on the parity check matrix, LDPC encoding is performed with respect to data to be input (S1910), and parity bits from among the LDPC codeword generated by the LDPC encoding is interleaved (S1920).

Subsequently, at least a part of the interleaved parity bits are punctured (S1930).

To be specific, the parity bits are grouped based on an interval at which a pattern of columns is repeated in the information word sub matrix constituting the parity check matrix, and puncturing is performed based on the number of parity bits to be punctured and the position of the parity bit groups to be punctured from among the grouped parity bit groups.

In this case, the step of S1930 may determine the position of the parity bit groups to be punctured based on the pre-defined puncturing pattern and the number of parity bits to be punctured.

To be specific, the number of parity bit groups to be punctured may be determined based on a value which is obtained by dividing the number of parity bits to be punctured by the interval at which a pattern of columns is repeated, and the position of the parity bit groups to be punctured may be determined according to the determined number of the parity groups and the pre-defined puncturing pattern.

In this case, if the number of the parity bits to be punctured is divided exactly by the interval at which a pattern of columns is repeated, the quotient is determined as the number of the parity bit groups to be punctured, and the parity bit groups at the determined position may be punctured by group according to the pre-defined paucturing pattern.

In addition, if the number of the parity bits to be punctured is not divided exactly by the interval at which a pattern of columns is repeated, the value which is obtained by adding '1' to the quotient is determined as the number of the parity bit groups to be punctured, and at least a part of the parity bit groups at the determined position may be punctured by group according to the pre-defined paucturing pattern.

In this case, if the quotient is '0', the parity bits as many as the remainder which is obtained by dividing the number of parity bits to be punctured by the internal at which a pattern of columns is repeated may be punctured at the parity bit groups at the determined position according to the pre-defined puncturing pattern.

Meanwhile, if the quotient is higher than '1', the parity bits as many as the remainder which is obtained by dividing the number of parity bits to be punctured by the internal at which a pattern of columns is repeated may be punctured at the last parity group from among parity bit groups at the determined position according to the pre-defined puncturing pattern, and the remaining parity bit groups may be punctured by group.

Meanwhile, the pre-defined puncturing pattern may be defined as shown in Table 6, and the interval at which a pattern of columns is repeated may be '360'.

Meanwhile, the specific method of puncturing parity bits have been already described above.

A non-transitory computer readable medium in which a program which sequentially performs a puncturing method is stored therein may be provided.

In addition, in the abovementioned block diagrams with respect to the transmitting apparatus and the receiving apparatus, Bus is not illustrated, but, communication among elements of the transmitting apparatus and the receiving apparatus may be performed via Bus. Further, each apparatus may further include a CPU which performs the above-described various steps or processors such as a micro processor.

The non-transitory recordable medium refers to a medium which may store data semi-permanently rather than storing data for a short time such as a register, a cache, and a memory and may be readable by an apparatus. Specifically, the above-mentioned various applications or programs may be stored in a non-temporal recordable medium such as compact disc (CD), digital video disk (DVD), hard disk, Blu-ray disk, USB, memory card, and read-only memory (ROM) and provided therein.

The foregoing embodiments and advantages are merely exemplary and are not to be construed as limiting the present invention. The present teaching can be readily applied to other types of apparatuses. Also, the description of the exemplary embodiments of the present inventive concept is intended to be illustrative, and not to limit the range of the claims, and many alternatives, modifications, and variations will be apparent to those skilled in the art.

What is claimed is:

1. A transmitting apparatus comprising:
   an encoder configured to encode information bits to generate parity bits based on a parity check matrix of a Low Density Parity Check (LDPC) code;
   a parity interleaver configured to interleave parity bits;
   a puncturer configured to perform puncturing one or more bits of the interleaved parity bits based on a number of parity bits to be punctured and a predefined puncturing pattern; and
   a transmitter that transmits a signal based on the information bits and the interleaved parity bits except the punctured one or more bits,
   wherein the puncturer splits the interleaved parity bits into a plurality of parity bit groups based on an interval, and determines a number of parity bit groups to be punctured based on a first value,
   wherein the interval is obtained based on a pattern of columns which is repeated in an information word sub matrix of the parity check matrix,
   wherein the first value is obtained based on a quotient and a remainder by dividing the number of parity bits to be punctured by the interval, and
   wherein if the remainder is not zero, the first value is obtained by adding 1 to the quotient.

2. The apparatus as claimed in claim 1, wherein if the number of the parity bits to be punctured is divided by the interval so that the first value is a natural number, the puncturer determines the first value as the number of the parity bit groups to be punctured, and punctures the parity bit groups on the determined position in a unit of groups according to the predefined puncturing pattern.

3. The apparatus as claimed in claim 1, wherein if the first value is 0, the puncturer punctures parity bits corresponding to a remainder obtained by dividing the number of the parity bits to be punctured by the interval in the parity bit groups on a position determined based on the number of parity bit groups to be punctured and the predefined puncturing pattern.

4. The apparatus as claimed in claim 1, wherein if the first value is higher than 1, the puncturer punctures parity bits corresponding to a remainder obtained by dividing the number of the parity bits to be punctured by the interval in a last parity group from among the parity bit groups on a position determined based on the number of parity bit groups to be punctured and the predefined puncturing pattern, and punctures the other parity bit groups in a unit of groups.

5. The apparatus as claimed in claim 1, wherein the predefined puncturing pattern is determined by a table as below:

| Code Rate | Order of parity group to be punctured, $\{\pi_p(j), 0 \leq j < Q_{ldpc} = 12\}$ | | | | | |
|---|---|---|---|---|---|---|
| 11/15 | $\pi_p(0)$ 2 | $\pi_p(1)$ 7 | $\pi_p(2)$ 11 | $\pi_p(3)$ 4 | $\pi_p(4)$ 9 | $\pi_p(5)$ 5 |
|  | $\pi_p(6)$ 0 | $\pi_p(7)$ 3 | $\pi_p(8)$ 8 | $\pi_p(9)$ 10 | $\pi_p(10)$ 1 | $\pi_p(11)$ 6 | where $\pi_p(j)$ refers to an index of a parity bit group which is punctured in $j^{th}$ order, and $Q_{ldpc}$ refers to a size by which each column is cyclic-shifted in the information word sub matrix.

6. The apparatus as claimed in claim 1, wherein the interval is 360.

7. A method of puncturing a transmitting apparatus, the method comprising:
encoding information bits to generate parity bits based on a parity check matrix of a Low Density Parity Check (LDPC) code;
interleaving parity bits;
perform puncturing one or more bits of the interleaved parity bits based on a number of parity bits to be punctured and a predefined puncturing pattern; and
transmitting, using a transmitter, a signal based on the information bits and the interleaved parity bits except the punctured one or more bits,
wherein the puncturing comprises splitting the interleaved parity bits into a plurality of parity bit groups based on an interval, and determines a number of parity bit groups to be punctured based on a first value,
wherein the interval is obtained based on a pattern of columns which is repeated in an information word sub matrix of the parity check matrix,
wherein the first value is obtained based on a quotient and a remainder by dividing the number of parity bits to be punctured by the interval, and
wherein if the remainder is not zero, the first value is obtained by adding 1 to the quotient.

8. The method as claimed in claim 7, wherein if the number of the parity bits to be punctured is divided by the interval so that the first value is a natural number, the puncturing comprises determining the first value as the number of the parity bit groups to be punctured, and puncturing the parity bit groups on the determined position in a unit of groups according to the predefined puncturing pattern.

9. The method as claimed in claim 7, wherein if the first value is 0, the puncturing comprises puncturing parity bits corresponding to a remainder obtained by dividing the number of the parity bits to be punctured by the interval in the parity bit groups on a position determined based on the number of parity bit groups to be punctured and the predefined puncturing pattern.

10. The method as claimed in claim 7, wherein if the first value is higher than 1, the puncturing comprises puncturing parity bits corresponding to a remainder obtained by dividing the number of the parity bits to be punctured by the interval in a last parity group from among the parity bit groups on a position determined based on the number of parity bit groups to be punctured and the predefined puncturing pattern, and punctures the other parity bit groups in a unit of groups.

11. The method as claimed in claim 7, wherein the predefined puncturing pattern is determined by a table as below:

| Code Rate | Order of parity group to be punctured, $\{\pi_p(j), 0 \leq j < Q_{ldpc} = 12\}$ | | | | | |
|---|---|---|---|---|---|---|
| 11/15 | $\pi_p(0)$ 2 | $\pi_p(1)$ 7 | $\pi_p(2)$ 11 | $\pi_p(3)$ 4 | $\pi_p(4)$ 9 | $\pi_p(5)$ 5 |
|  | $\pi_p(6)$ 0 | $\pi_p(7)$ 3 | $\pi_p(8)$ 8 | $\pi_p(9)$ 10 | $\pi_p(10)$ 1 | $\pi_p(11)$ 6 | where $\pi_p(j)$ refers to an index of a parity bit group which is punctured in $j^{th}$ order, and $Q_{ldpc}$ refers to a size by which each column is cyclic-shifted in the information word sub matrix.

12. The method as claimed in claim 7, wherein the interval is 360.

* * * * *